US012560637B2

(12) United States Patent
Bickel

(10) Patent No.: US 12,560,637 B2
(45) Date of Patent: Feb. 24, 2026

(54) AUTOMATIC ASSESSMENT OF ELECTRICAL UNBALANCE ON THREE-PHASE LOADS

(71) Applicant: Schneider Electric USA, Inc., Boston, MA (US)

(72) Inventor: Jon A. Bickel, Murfreesboro, TN (US)

(73) Assignee: SCHNEIDER ELECTRIC USA, INC., Boston, MA (US)

( * ) Notice: Subject to any disclaimer, the term of this patent is extended or adjusted under 35 U.S.C. 154(b) by 149 days.

(21) Appl. No.: 18/603,538

(22) Filed: Mar. 13, 2024

(65) Prior Publication Data

US 2025/0290962 A1      Sep. 18, 2025

(51) Int. Cl.
| | | |
|---|---|---|
| *G01R 29/16* | (2006.01) | |
| *G01R 31/08* | (2020.01) | |
| *H02J 3/26* | (2006.01) | |

(52) U.S. Cl.
CPC .......... *G01R 29/16* (2013.01); *G01R 31/088* (2013.01); *H02J 3/26* (2013.01)

(58) Field of Classification Search
None
See application file for complete search history.

(56) References Cited

U.S. PATENT DOCUMENTS

| | | | |
|---|---|---|---|
| 10,718,813 B2 | 7/2020 | Bickel | |
| 11,217,980 B1 * | 1/2022 | Mitteltstadt ............ | H02B 1/205 |
| 11,695,427 B2 | 7/2023 | Bickel et al. | |
| 11,927,609 B2 | 3/2024 | Song et al. | |
| 2011/0153236 A1 | 6/2011 | Montreuil et al. | |
| 2023/0152833 A1 | 5/2023 | Bickel | |
| 2023/0358798 A1 | 11/2023 | Yu et al. | |

OTHER PUBLICATIONS

Search Report from EP Application No. 25161564.7, mailed Aug. 18, 2025, 6 pages.

* cited by examiner

*Primary Examiner* — Farhana A Hoque
(74) *Attorney, Agent, or Firm* — Stinson LLP

(57) ABSTRACT

Method and system for assessing and managing an electrical unbalance condition associated with a three-phase electrical system. An Intelligent Electronic Device (IED) coupled to the load acquires energy-related signals associated with the electrical system. A processor is configured to characterize electrical unbalance between a plurality of conductors analyze data associated with the characterization to identify electrical unbalance across the plurality of conductors, and determine the extent of the contribution of the electrical source(s), and the extent of the contribution of the load(s) in the electrical system, to the identified electrical unbalance condition.

28 Claims, 11 Drawing Sheets

FIG. 3

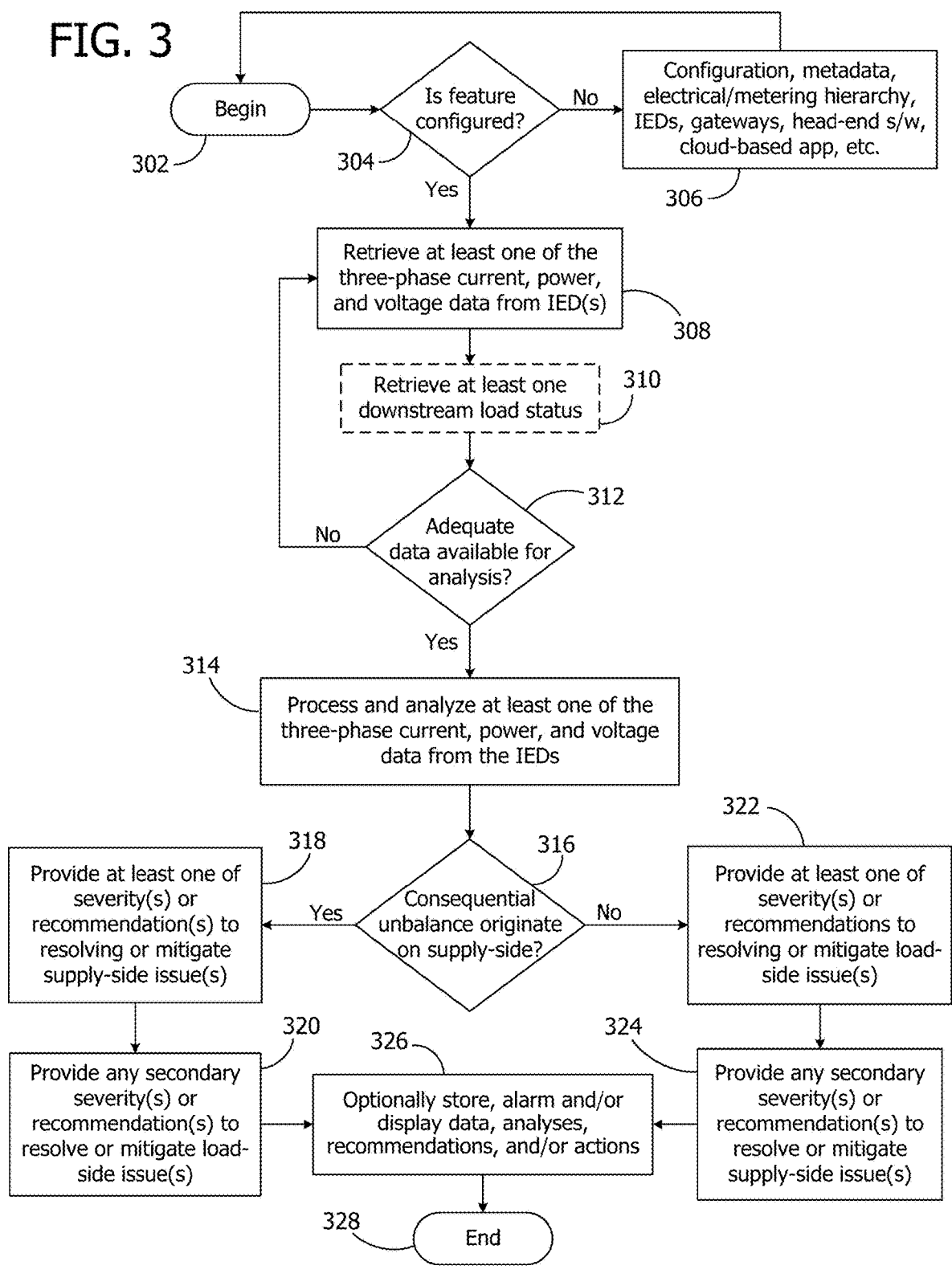

Begin
302

Is feature configured?
304

No → Configuration, metadata, electrical/metering hierarchy, IEDs, gateways, head-end s/w, cloud-based app, etc.
306

Yes

Retrieve at least one of the three-phase current, power, and voltage data from IED(s)
308

Retrieve at least one downstream load status
310

Adequate data available for analysis?
312

No

Yes

Process and analyze at least one of the three-phase current, power, and voltage data from the IEDs
314

Consequential unbalance originate on supply-side?
316

Yes → Provide at least one of severity(s) or recommendation(s) to resolving or mitigate supply-side issue(s)
318

No → Provide at least one of severity(s) or recommendations to resolving or mitigate load-side issue(s)
322

Provide any secondary severity(s) or recommendation(s) to resolve or mitigate load-side issue(s)
320

Provide any secondary severity(s) or recommendation(s) to resolve or mitigate supply-side issue(s)
324

Optionally store, alarm and/or display data, analyses, recommendations, and/or actions
326

End
328

Sums of the Rows Cells $\Sigma_1 \, (a_{11} + a_{32} + a_{23})$ $\Sigma_2 \, (a_{21} + a_{12} + a_{33})$ $\Sigma_3 \, (a_{31} + a_{22} + a_{13})$ Solution Set 1  $a_{11}$   $a_{32}$   $a_{23}$ 2  $a_{21}$   $a_{12}$   $a_{33}$ 3  $a_{31}$   $a_{22}$   $a_{13}$ Sums of the Columns Cells $\Sigma_A \, (a_{11} + a_{21} + a_{31})$ $\Sigma_B \, (a_{32} + a_{12} + a_{22})$ $\Sigma_C \, (a_{23} + a_{33} + a_{13})$ Solution Set

A    B    C $a_{11}$   $a_{32}$   $a_{23}$ $a_{21}$   $a_{12}$   $a_{33}$ $a_{31}$   $a_{22}$   $a_{13}$

Original Set                                Solution Set

Solution Set                    Sums of
                                Rows Cells

AUTOMATIC ASSESSMENT OF ELECTRICAL UNBALANCE ON THREE-PHASE LOADS

FIELD

The present disclosure relates generally to electrical/ power systems, and more particularly, to systems and methods for monitoring and assessing energy-related data in an electrical system.

BACKGROUND

Three-phase systems are generally unable to maintain precise balance across the three phases, so each motor phase can experience different power flows on discrete phases during startup and run conditions. IEEE 1159-2019-Recommended Practice for Monitoring Electric Power Quality defines unbalance (voltage or current) as the ratio of the negative sequence component to the positive sequence component, usually expressed as a percentage, where unbalance is a steady-state phenomenon exhibiting voltage magnitudes of 0.5-5% and current magnitudes of 1-3%. It should be noted that the terms "imbalance" and "unbalance" may be used interchangeably.

Voltage unbalance, for instance, can adversely affect three-phase equipment, specifically three-phase induction motors that are common in industrial and commercial facilities. There are two basic rules-of-thumb regarding the effects of voltage unbalance: 1) additional heating varies as the cube of voltage unbalance; and 2) insulation life is halved for every 10° C. increase in temperature. Therefore, when a source provides unbalanced voltages to a three-phase induction motor, the resulting unbalanced line currents cause additional heating and decrease the motor's life.

Conventional power monitoring systems measure, capture, alarm, and periodically analyze data from electrical systems, but it is generally left to end-users to evaluate the data and draw their own conclusions relative to the application in their system. Standards organizations such as the National Electrical Manufacturers Association (NEMA) and the International Electrotechnical Commission (IEC) have each developed general equations to determine electrical unbalance. Voltage unbalance is typically measured in metering devices and other Intelligent Electronic Device (IEDs) using either the NEMA or the IEC technique to quantify its value. Unfortunately, neither equation provides any direct information about the sources and effects of unbalance in three-phase electrical systems and the majority of energy consumers do not have the time and expertise to evaluate the energy-related data for themselves. Additionally, data produced by power monitoring systems is often an amalgamation of loads making it difficult to identify, quantify, analyze, and respond to discrete issues involving, for example, specific equipment.

Commonly assigned U.S. Pat. No. 10,718,813, the entire disclosure of which is incorporated herein by reference, discloses a method of automatically identifying an anomalous condition of an induction motor by normalizing the voltage measured across its terminals relative to the power flow to the motor or the motor's impedance.

Commonly assigned U.S. Pat. No. 11,695,427, the entire disclosure of which is incorporated herein by reference, discloses capturing at least one energy-related waveform using at least one IED in an electrical system.

Monitoring energy-related data in an electrical system as disclosed in commonly assigned U.S. Pat. No. 11,740,266, the entire disclosure of which is incorporated herein by reference, includes processing energy-related data extracted or derived from energy-related signals captured by at least one IED in the electrical system to identify at least one variation/change in the energy-related signals.

SUMMARY

Aspects of the present disclosure automatically evaluate steady-state voltage unbalance in electrical systems, focusing on its impact on three-phase loads (including motors). Because voltage unbalance in three-phase motors causes additional heating in motor winding insulation, the windings may prematurely fail thus shortening the life of the motor. Additionally, voltage unbalance decreases motor energy efficiency leading to supplemental energy losses. Aspects of the disclosure address the effects of voltage unbalance on three-phase motors and other loads, and how motors can influence voltage unbalance in an electrical system. In this regard, such aspects determine energy-related impacts due to voltage unbalances (e.g., energy cost, equipment cost, etc.), quantify the influence of three-phase loads (including motors) on electrical measurements in IEDs related to electrical system unbalance, uncover potential improvements for electrical efficiency(s) and performance(s), and identify opportunities to increase equipment life.

In an aspect, a method of assessing and managing an electrical unbalance condition associated with a three-phase electrical system under analysis comprises acquiring, by at least one IED of the electrical system, energy-related signals associated with the electrical system. The method also includes processing the energy-related signals acquired by the at least one IED to construct a characterization of an electrical unbalance between a plurality of conductors based thereon. The energy-related signals comprise a plurality of measurements taken over time from the plurality of conductors. The method further includes analyzing data associated with the characterization to identify the electrical unbalance across the plurality of conductors and determining the extent of contribution of one or more electrical sources, and the extent of contribution of one or more loads in the electrical system, to the identified electrical unbalance condition.

In another aspect, a system for assessing and managing an electrical unbalance condition associated with a three-phase electrical system under analysis comprises at least one IED communicatively coupled to the three-phase load of the electrical system and configured to acquire energy-related signals associated with the electrical system. The system also includes a processor receiving and responsive to the energy-related signals acquired by the at least one IED and a memory storing processor-executable instructions. When executed, the instructions configure the processor to construct a characterization of an electrical unbalance between a plurality of conductors based on the energy-related signals. The energy-related signals comprise a plurality of measurements taken over time from the plurality of conductors. The instructions further configure the processor to analyze data associated with the characterization to identify the electrical unbalance across the plurality of conductors and determine the extent of contribution of one or more electrical sources, and the extent of contribution of one or more loads in the electrical system, to the identified electrical unbalance condition.

Other objects and features of the present invention will be in part apparent and in part pointed out herein.

BRIEF DESCRIPTION OF THE DRAWINGS

FIG. 3 is a flow diagram illustrating an example process for assessing voltage unbalance in accordance with embodiments of the disclosure.

Corresponding reference characters indicate corresponding parts throughout the drawings.

DETAILED DESCRIPTION

Figure 1:
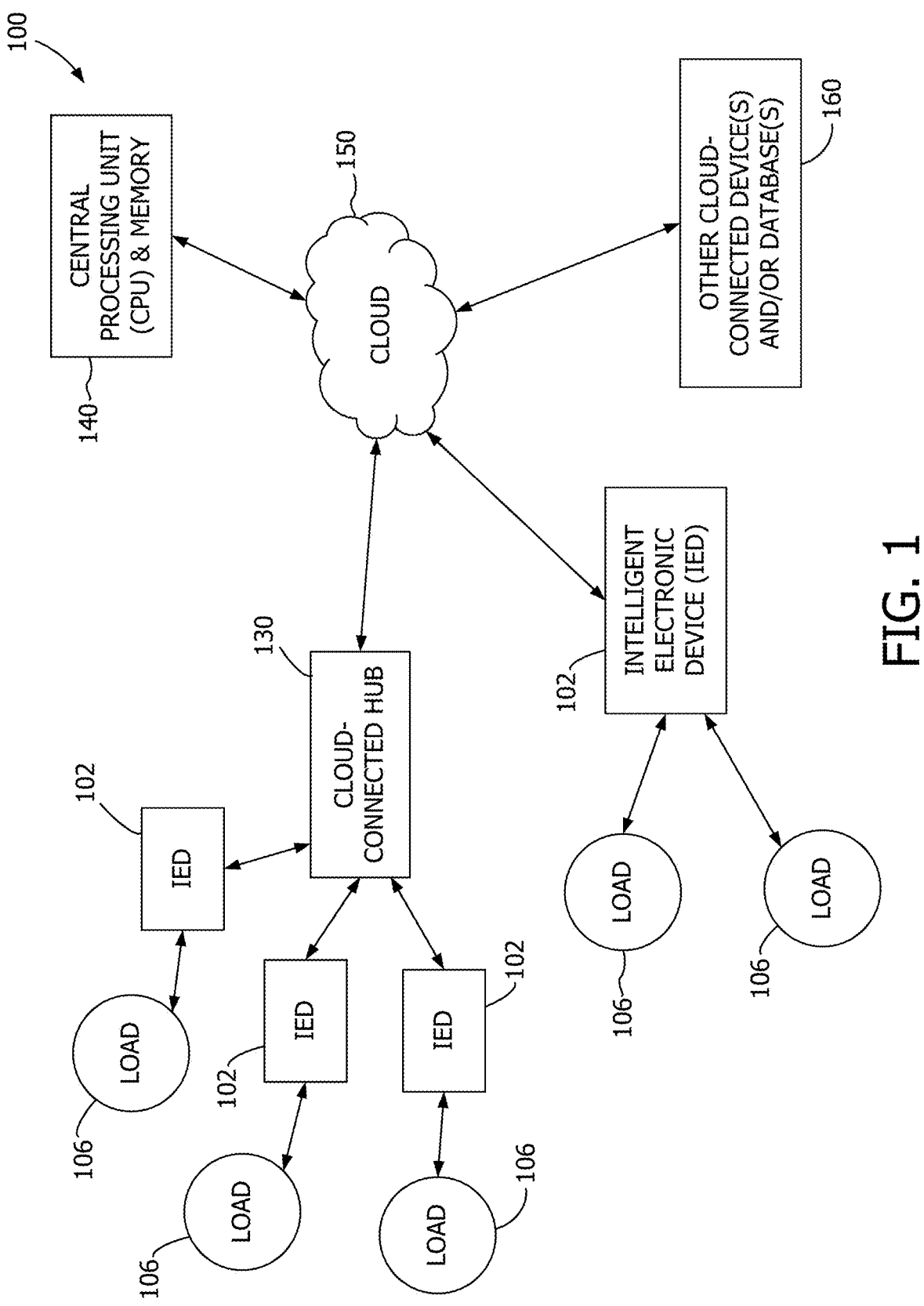
FIG. 1 illustrates an example electrical system in accordance with embodiments of the disclosure.

The features and other details of the concepts, systems, and techniques sought to be protected herein will now be more particularly described. It will be understood that any specific embodiments described herein are shown by way of illustration and not as limitations of the disclosure and the concepts described herein. Features of the subject matter described herein can be employed in various embodiments without departing from the scope of the concepts sought to be protected.

Electrical unbalance implicitly applies to multi-phase/polyphase electrical systems. In a balanced three-phase electrical power system, all three phase voltages are equal in magnitude and have a phase displacement of 120° from each other. Any deviation from these constraints will result in a voltage unbalance with potentially adverse effects to the connected equipment/loads. There are many causes of voltage and current unbalance, including disproportionate circuit impedances, unequally dispersed single-phase loads, unbalanced three-phase loads, and open-phase conductors. The most significant cause of voltage unbalance on three-phase electrical systems is the loss of one or two of the three phase inputs. In this case, the unbalance is extremely severe and can significantly impact the life of a three-phase induction motor that continues to operate under these conditions. A perfectly balanced polyphase system is essentially impossible to continuously achieve in real applications, so virtually all three-phase systems typically experience some level of voltage and current unbalance. It is important that these unbalances be reasonably minimized to reduce the adverse effects on equipment loads. For example, a motor operating at 100% of its nameplate load during unbalanced voltage conditions will exceed its current rating, resulting in additional motor losses and heating, lower motor efficiency, and decreased life of the motor's insulation.

Embodiments in accordance with the present disclosure evaluate three-phase unbalance issues to identify, quantify, troubleshoot, and address issues related primarily to the susceptibilities and influences on three-phase motors in electrical systems. Two important aspects are identifying the source (e.g., upstream or downstream from an IED or within a system of IEDs) of three-phase unbalance issues and quantifying the impact (e.g., heating, wasted energy, etc.) of unbalance on equipment effect within electrical systems. A general industry rule of thumb is that motors consume more than ten times their original purchase cost in energy costs per year. This means that any motor energy efficiency improvements can add up to substantial savings in money and emissions over time. Moreover, embodiments in accordance with the present disclosure also provide the added benefit of decreasing capital costs by increasing equipment longevity.

A well-known motor derating curve developed by NEMA (NEMA MG-1-2021) for three-phase induction motors specifies when a three-phase motor operating at its rated load should be derated based on the extent of voltage unbalance at the motor terminals. Based on this derating curve, any three-phase NEMA-rated induction motor should be able to tolerate a 1% voltage unbalance without derating the motor; however, higher voltage unbalance levels (not to exceed 5%) should result in a corresponding derating of the motor load based on the derating curve. For example, consider a 100 kW three-phase induction motor that is operating fully loaded with a voltage unbalance of 3.5%. The motor should be derated to about 85% of its full-load rating (i.e., 85 KW). If derating the motor is not possible (i.e., 100 kW is required), then a larger motor (e.g., ideally rated at 117 kW) or having a service factor of 1.15 (i.e., when the unbalances are intermittent) should be used.

Known causes of voltage unbalance on three-phase electrical systems include feeder balancing (2-5% Voltage), winding shorts, or open-delta configurations in transformers (2-5% Voltage), capacitor issues such as blown fuses or failures (2-5% Voltage), and single phasing (>10% Voltage). Because voltage unbalance on three-phase systems can lead to unexpected downtime and expenses, unbalance levels are important to continuously monitor, assess, and mitigate. Additional heating of three-phase induction motors caused by unbalance conditions should be minimized to decrease maintenance and capital costs.

As mentioned above, standards organizations such as NEMA and IEC have developed general equations to assess electrical unbalance.

NEMA unbalance discussed in NEMA Standard MG-1-2021 is generally a straightforward calculation using line voltages, and is sometimes referred to as the line voltage unbalance rate (LVUR). It is defined as:

$$\% \ LVUR = \frac{\text{Maximum deviation from mean of } \{V_{ab}, V_{bc}, V_{ca}\}}{\text{Mean of } \{V_{ab}, V_{bc}, V_{ca}\}} \times 100 \quad \text{(Eqn. 1)}$$

It should be noted that the LVUR calculation only uses voltage magnitudes; phase angles are not considered.

The IEEE approach is very similar to the NEMA approach but considers phase voltages instead of line voltages. It is generally referred to as the phase voltage unbalance rate (PVUR), and is given by:

$$\% \, PVUR = \qquad \text{(Eqn. 2)}$$

$$\frac{\text{Maximum deviation from mean of } \{V_{an}, V_{bn}, V_{cn}\}}{\text{Mean of } \{V_{an}, V_{bn}, V_{cn}\}} \times 100$$

Again, it should be noted that the PVUR calculation only uses voltage magnitudes; phase angles are not considered.

The True/IEC unbalance approach is somewhat more complex to calculate and inherently includes the influence of phase angles on unbalance. It is referred to as voltage unbalance factor (VUF) or percent voltage unbalance factor (% VUF), and is determined by the following equation:

$$\% \, VUF = \frac{V_-}{V_+} \times 100 \qquad \text{(Eqn. 3)}$$

where "V−" refers to the negative sequence voltage component and "V+" refers to the positive sequence voltage component. The determination of these values involves calculating symmetrical components for the three unbalanced line voltages, and should be readily understood by a person having ordinary skill in the art.

The NEMA/IEEE and True/IEC calculations may vary from each other, generally diverging as the unbalance increases, but their results are nominally comparable below an unbalance level of 5%. It is to be understood that three-phase current unbalance may be calculated using similar equations as those provided above, substituting the respective currents for the voltages in the equations.

Referring to FIG. 1, an example electrical system 100 in accordance with embodiments of the disclosure includes one or more intelligent electronic devices (IEDs) 102 capable of sampling, sensing, or monitoring one or more parameters (e.g., power monitoring parameters) associated with one or more loads 106 (also sometimes referred to herein as "equipment" or "apparatuses"). Although indicated with the same reference numeral, it is to be understood that the IEDs 102 may differ from each other (e.g., IEDs with different features and capabilities, etc.) and loads 106 may differ from each other (e.g., motors, lighting, computer servers, etc.) depending on the specific design and features of the electrical system 100. In embodiments, loads 106 and IEDs 102 may be installed in one or more buildings or other physical locations or they may be installed on one or more processes and/or loads within a building. The buildings may correspond, for example, to commercial, industrial, or institutional buildings.

As shown in FIG. 1, IEDs 102 are each coupled to one or more of the loads 106, which may be located "upline/upstream" or "downline/downstream" from the IEDs in some embodiments. The loads 106 include, for example, machinery or apparatuses associated with a particular application (e.g., an industrial application), applications, and/or process(es). The machinery may include electrical or electronic equipment, for example. The machinery may also include the controls and/or ancillary equipment associated with the equipment. In accordance with aspects of the present disclosure, loads 106 comprise a mix of single-phase and three-phase loads (e.g., motors).

In embodiments, IEDs 102 may monitor and, in some embodiments, analyze parameters (e.g., energy-related parameters) associated with loads 106 to which they are coupled. For instance, IED 102 (e.g., a metering device) captures energy-related waveforms in electrical system 100.

As used herein, an IED is a computational electronic device optimized to perform a particular function or set of functions. Examples of IEDs 102 include smart utility meters, power quality meters, microprocessor relays, digital fault recorders, and other metering devices. The IEDs 102 may also be embedded in variable speed drives (VSDs), uninterruptible power supplies (UPSs), circuit breakers, relays, transformers, or any other electrical apparatus. In addition, IEDs 102 may be used to perform measurement/monitoring and control functions in a wide variety of installations. The installations may include utility systems, industrial facilities, warehouses, office buildings or other commercial complexes, campus facilities, computing co-location centers, data centers, power distribution networks, or any other structure, process or load that uses electrical energy. For example, where IED 102 is an electrical power monitoring device, it may be coupled to (or be installed in) an electrical power transmission or distribution system and configured to sense/measure and store data (e.g., waveform data, logged data, I/O data, etc.) as electrical parameters representing operating characteristics (e.g., voltage, current, waveform distortion, power, etc.) of the electrical distribution system. These parameters and characteristics may be analyzed by a user to evaluate potential performance, reliability and/or power quality-related issues, for example. One or more of the IEDs 102 may include at least a controller (which in certain IEDs can be configured to run one or more applications simultaneously, serially, or both), firmware, a memory, a communications interface, and connectors that connect the IED to external systems, devices, and/or components at any voltage level, configuration, and/or type (e.g., AC, DC). At least certain aspects of the monitoring and control functionality of IED 102 may be embodied in a computer program that is accessible by the IED.

In some embodiments, the term "IED" as used herein may refer to a hierarchy of IEDs operating in parallel and/or tandem (series). For example, an IED may correspond to a hierarchy of energy meters, power meters, and/or other types of resource meters. The hierarchy may comprise a tree-based hierarchy, such a binary tree, a tree having one or more child nodes descending from each parent node or nodes, or combinations thereof, wherein each node represents a specific IED. In some instances, the hierarchy of IEDs may share data or hardware resources and may execute shared software. It is understood that hierarchies may be nonspatial such as billing hierarchies where IEDs grouped together may be physically unrelated.

According to another aspect, IEDs 102 may detect overvoltage and undervoltage conditions (e.g., transient overvoltages), as well as other parameters such as temperature, including ambient temperature. According to a further aspect, IEDs 102 may provide indications of monitored parameters and detected conditions that can be used to control loads 106 and other equipment in the electrical system 100 in which loads 106 and IEDs 102 are installed. A wide variety of other monitoring and/or control functions can be performed by IEDs 102 and the aspects and embodiments disclosed herein are not limited to IEDs 102 operating as described in the above-mentioned examples.

It is to be understood that IEDs 102 may take various forms and may each have an associated complexity (or set of functional capabilities and/or features). For example, one IED 102 is a "basic" IED while another IED 102 is an "intermediate" IED and yet another IED 102 is an "advanced" IED. In such embodiments, the intermediate IED may have more functionality (e.g., energy measurement features and/or capabilities) than the basic IED, and advanced IED may have more functionality and/or features than both the intermediate IED and the basic IED. For example, in embodiments IED 102 (e.g., an IED with basic capabilities and/or features) may be capable of monitoring instantaneous voltage, current energy, demand, power fac- ⁵ tor, averages values, maximum values, instantaneous power, and/or long-duration rms variations and/or IED 102 (e.g., an IED with advanced capabilities) may be capable of monitoring additional parameters such as voltage transients, voltage fluctuations, frequency slew rates, harmonic power ¹⁰ flows, and discrete harmonic components, all at higher sample rates, etc. It is understood that this example is for illustrative purposes only, and likewise in some embodiments an IED with basic capabilities may be capable of monitoring one or more of the above energy measurement ¹⁵ parameters that are indicated as being associated with an IED with advanced capabilities. It is also understood that in some embodiments the IEDs 102 each have independent functionality.

In the example embodiment of FIG. 1, IEDs 102 are ²⁰ communicatively coupled to a central processing unit (CPU) 140 (and associated memory) via a data communications network shown as "cloud" 150. In some embodiments, IEDs 102 may be directly communicatively coupled to the cloud 150. In other embodiments, IEDs 102 may be indirectly ²⁵ communicatively coupled to cloud 150 via, for example, an intermediate device such as a cloud-connected hub 130 (or a gateway) providing IEDs 102 with access to cloud 150 and CPU 140.

Commonly assigned U.S. Patent Application Publication ³⁰ No. 2023/0152833, the entire disclosure of which is incorporated herein by reference, discloses a cloud-connected electrical system in which aspects of the present disclosure may be used.

Figure 2:
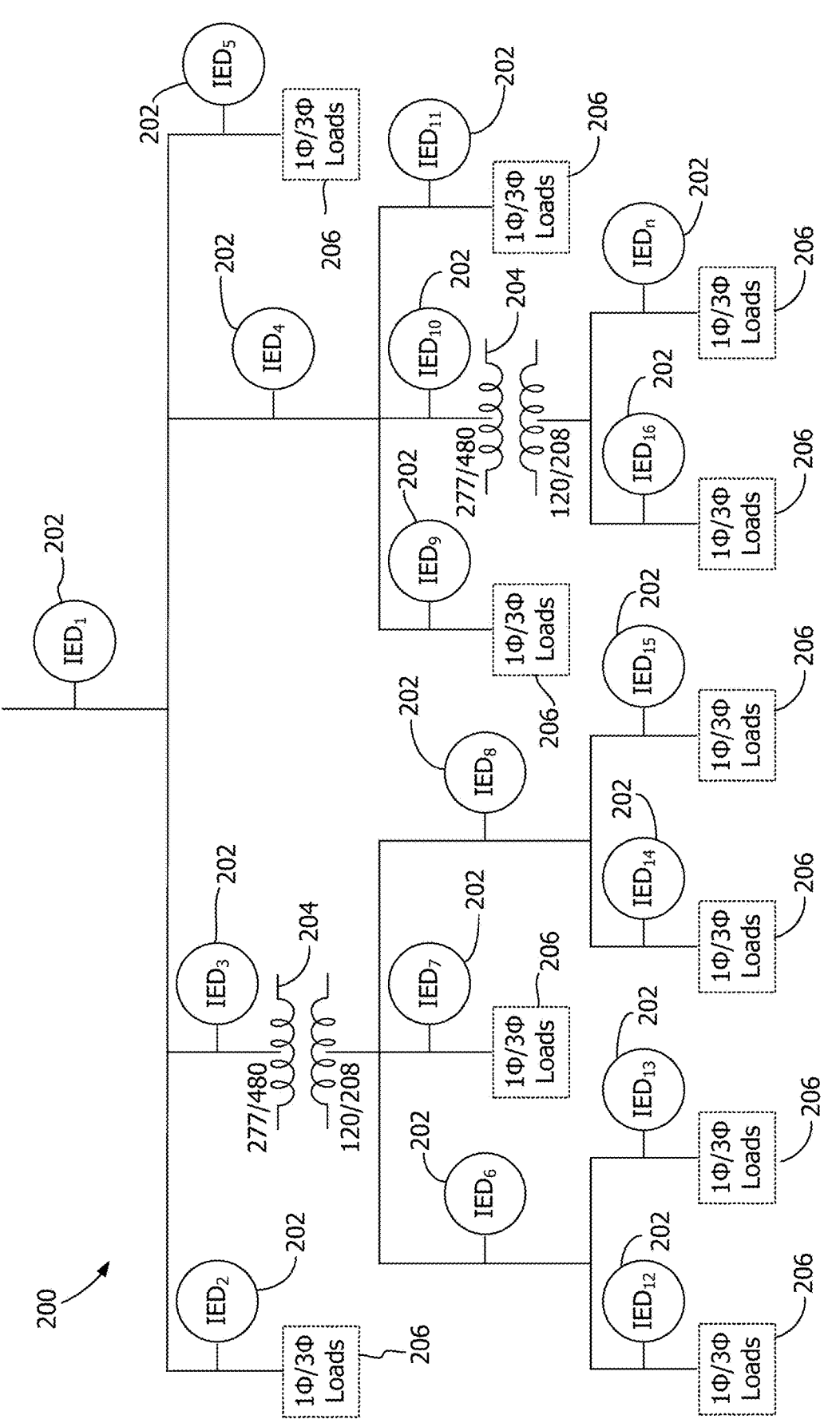
FIG. 2 illustrates another example electrical system in accordance with embodiments of the disclosure.

FIG. 2 illustrates another example electrical system 200 ³⁵ for which aspects of the present disclosure may be used to automatically assess voltage unbalance. One or more embodiments may optionally use location information of one or more IEDs 202 within the electrical system 200 to provide spatial context. For example, FIG. 2 illustrates ⁴⁰ system 200 with two step-down transformers 204 and multiple IEDs 202 monitoring a mix of single-phase and three-phase downstream loads 206. It is to be understood that the electrical system 200 of FIG. 2 is just one embodiment of many potential embodiments to teach the concepts described ⁴⁵ herein.

FIG. 3 illustrates an example process embodying aspects of the present disclosure, which permits analysis of historical operational data to determine both the influence of unbalance on loads 106, 206 (i.e., three-phase motors in this ⁵⁰ example), and importantly, the influence of three-phase motors on an unbalance within an electrical system such as electrical system 100 or electrical system 200. Additionally, energy losses associated with rebalancing of unbalanced three-phase loads 106, 206 are also addressed and deter- ⁵⁵ mined.

The process begins at 302 and determines at 304 whether voltage unbalance assessment feature is configured. If not, the process evaluates information concerning configuration, metadata, electrical/metering hierarchy, IEDs, gateways, ⁶⁰ head-end software, cloud-based apps, etc. at 306 before returning to 302. One or more embodiments evaluate electrical signals (i.e., voltage, current, power, or other derived energy-related signals or energy-related data) to analyze/ evaluate/assess unbalance and provide one or more of sever- ⁶⁵ ity(ies), location(s), and recommendation(s) accordingly. The energy-related signals acquired by the at least one IED

102, 202 may include I/O data. It is to be understood that the I/O data may take the form of digital I/O data, analog I/O data, or a combination digital and analog I/O data. The I/O data may convey status information (e.g., on, off, etc.), for example, and many other types of information, as will be apparent to one of ordinary skill in the art from the present disclosure. Aspects of the disclosure apply to one or more IEDs, gateways, edge/head-end software systems, and/or cloud-based systems (or applications within said devices or systems).

Proceeding to 308, the process retrieves at least one of the three-phase voltage, current, and power data from one or more IEDs 102, 202 of the electrical system 100, 200 under analysis. Additionally, the process optionally retrieves at least one downstream load status at 310. If adequate data is available for analysis, as determined at 312, the process proceeds to 314 for processing and analyzing at least one of the three-phase voltage, current, and power data from the IEDs 102, 202.

It is an unrealistic expectation to design and operate a three-phase electrical system that can continuously maintain perfect voltage balance. This is often due to the arbitrary operation (and their associated changes in impedance) of single-phase loads and their random distribution across the three-phase electrical systems. Moreover, the impedance of three-phase electrical loads such as motors, etc. are never perfectly balanced. However, it is possible to take steps (whether as an energy producer or consumer) to minimize the level of voltage unbalance, including:

Balancing electrical system distribution impedances;
Equally distributing single-phase loads on all three phases;
Load balancing;
Isolating single-phase loads from critical three-phase distribution systems; and
Installing a mitigation equipment (e.g., dynamic voltage restorer (DVR), voltage regulator, boost-buck transformer, static VAR compensator, line conditioner).

In the event a consequential unbalance is determined at 316 to originate upstream from IED 102, 202, the process provides at least one of severity(ies) or recommendation(s) to resolving or mitigating supply-side issue(s) at 318 and provides any secondary severity(ies) or recommendation(s) to resolve or mitigate load-side issue(s) at 320. In the event a primary unbalance is determined at 316 to originate downstream from IED 102, 202, the process provides at least one of severity(ies) or recommendation(s) to resolving or mitigating load-side issue(s) at 322 and provides any secondary severity(ies) or recommendation(s) to resolve or mitigate supply-side issue(s) at 324. The process optionally stores, alarms, and/or displays data, analyses, assessments, recommendations, and/or actions at 326. The process ends at 328.

In an embodiment, processing and analyzing of at least one of the three-phase voltage, current, and power data from the IEDs 102, 202 at 314 includes processing and analyzing data from discrete (single) locations of IED 102, 202 within the electrical system 100, 200, and the results (output) discriminate between upstream and downstream sources of unbalance. The three-phase voltage, current, and power analyses of data are performed similarly, and may use line (or line-to-line) or phase (line-to-neutral/ground) values as long as the parameters within the data sets to be analyzed are all the consistent; that is, analyzing line-to-line values against line-to-line values or analyzing line-to-neutral/ ground values against line-to-neutral/ground values). Likewise, the power parameters within the data sets to be analyzed should all be consistent; that is, active power should only be evaluated against active power, reactive power should only be evaluated against reactive power, and apparent power should only be evaluated against apparent power.

Configuration of programming embodying features of the present disclosure (i.e., in the device, gateway, software, and/or cloud-based application) preferably includes any parameter to be evaluated (e.g., voltage, current, real power, apparent power, reactive power, etc., or multiple combinations thereof, for example). The configured data to be analyzed may also include a periodic data sample rate (i.e., acquisition rate, logging interval, etc.) with an associated timestamp. The acquisition of data may be time-based (e.g., periodic), process-based (e.g., while certain equipment or processes are operating), arbitrary (e.g., random or aperiodic), and/or some combination thereof, for example. The sample/measurement rate of the data in an embodiment may be anywhere from one cycle to a year or longer (e.g., cycles, seconds, minutes, hours, days, weeks, months, seasons, years, etc.), but is optimally in minutes, hours, or daily. For example, systems are often configured to capture current values every 5 minutes, or capture apparent power every 15 minutes. Samples/measurements of the data may also occur at designated times within a process when specific equipment is operating.

An optional digital and/or analog I/O may also be configured. In an example, IED 102, 202 includes a digital status input that requires configuration and an analog input (e.g., from a thermocouple) that requires calibration as part of its configuration.

In one or more embodiments, configuration is performed automatically, manually, or a combination of both. The IED 102, 202 and/or the gateway, edge software and/or cloud-based application may be designed to analyze the relevant data already being capture or accumulated. For example, IED 102, 202 is configurable to capture 15-minute demand values for billing purposes. Assuming the 15-minute demand values include phase data, i.e., $S_A$ (Phase A apparent power), $S_B$ (Phase B apparent power), $S_C$ (Phase C apparent power), algorithms embodying aspects of the present disclosure are able to leverage this information to provide unbalance analyses and results. Similarly, edge software acquiring three-phase current values from one or more IEDs 102, 202 within an electric power monitoring system (EPMS) can be used to provide information relating to unbalance from both a discrete and system perspective. In each of these cases, the data does not have to be analyzed in "real time" but can be assessed at any time "after the fact" from history taken from databases, etc.

Figure 4:
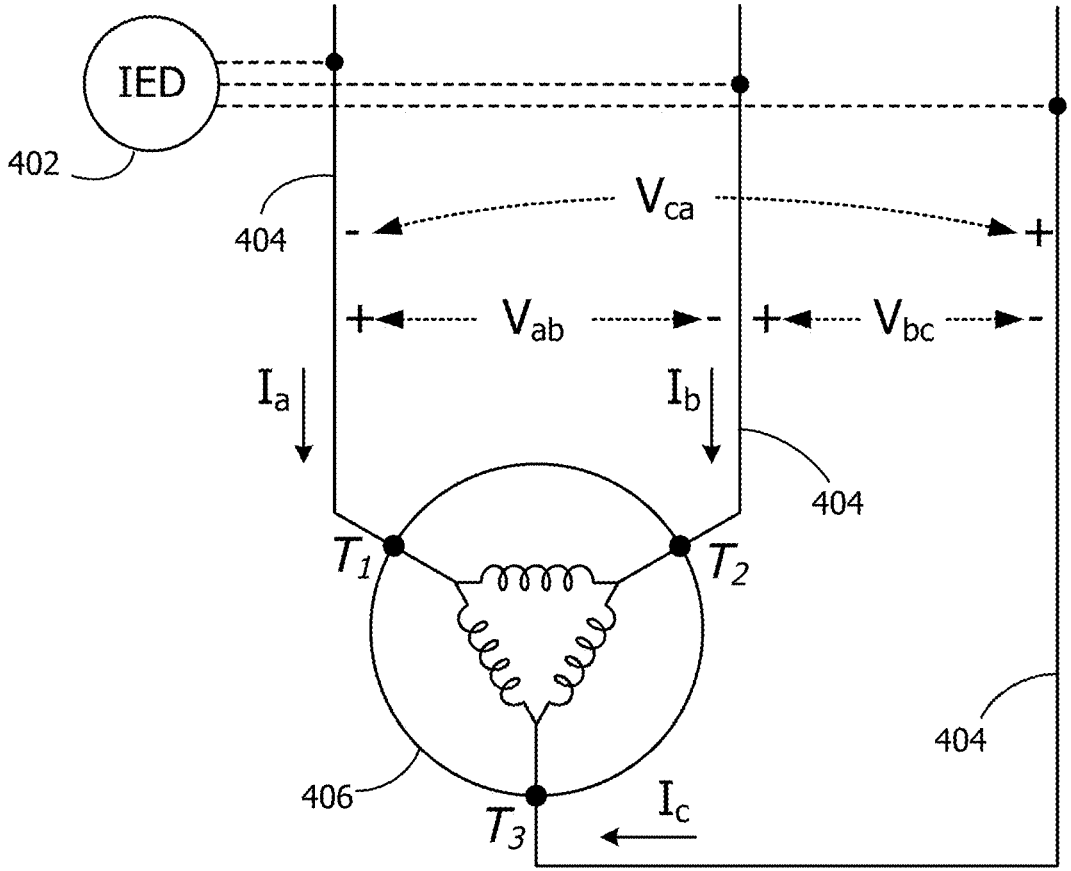
FIG. 4 is a schematic diagram illustrating an example of a three-phase system connected to a delta-wound three-phase load in accordance with embodiments of the disclosure.
Figure 5:
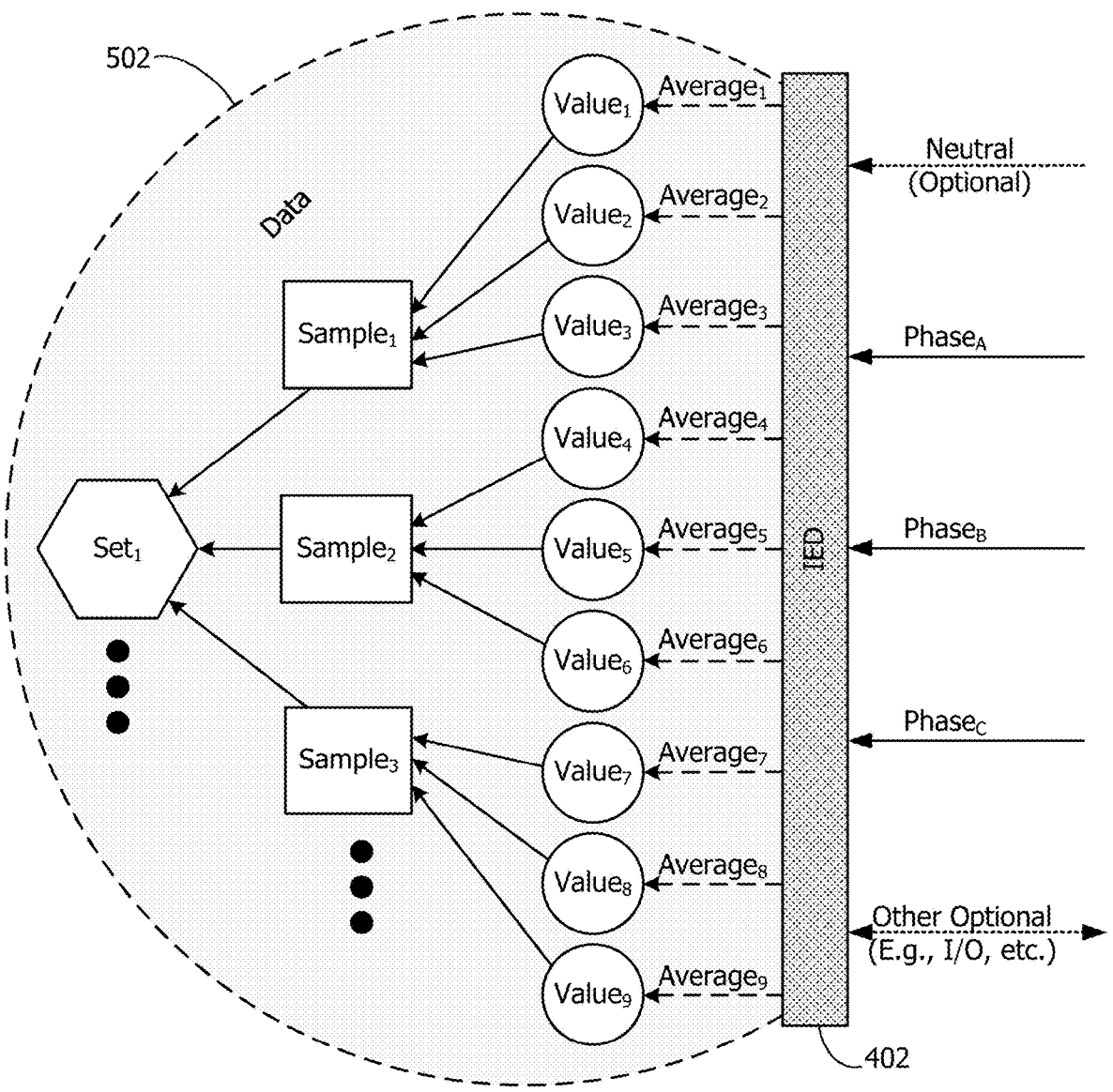
FIG. 5 illustrates data relationships for an example of acquiring data by an IED in accordance with embodiments of the disclosure.

FIGS. 4 and 5 are informative of acquisition of the individual parameters to be analyzed (e.g., three-phase current, three-phase apparent power, three-phase real power, etc.) and how data, sets, samples, and values interrelate with each other in accordance with one or more embodiments. FIG. 4 illustrates an example of a simple three-phase application. As shown in FIG. 4, an IED 402, such as IED 102 of FIG. 1 or IED 202 of FIG. 2, acquires electrical data and information from three conductors 404 feeding a three-phase motor load 406, such as load 106 of FIG. 1 or load 206 of FIG. 2. It is to be understood that acquiring data as described herein may include acquisition, measurement, capture, logging, etc. The acquisition of data from the three conductors 404 is acquired as a group sample either substantially synchronously (or pseudo-synchronously) as a "group of three" values from each IED 402. As used herein, "synchronous" means synchronous or pseudo-synchronous such that the acquisition occurs at the same time or substantially the same time. A group sample includes three representative measurement values from the three-phase system associated with a first Phase A, a second Phase B, and a third Phase C (e.g., Phase A current, Phase B current, Phase C current, respectively). Again, it is important to note that all three measurement values (i.e., values within the group sample) are acquired synchronously or pseudo-synchronously. It is to be understood that conventions and nomenclatures are used herein for the purposes of differentiation and description and are not limiting (e.g., Phase A could be Phase 1, etc.). Aspects of the present disclosure are not limited or constrained based on the naming conventions, nomenclatures, examples, etc.

FIG. 5 illustrates data relationships; namely, values, samples, and sets, for one example of acquiring data by IED 402 according to an embodiment. The right side of this figure illustrates inputs. In this example, IED 402 acquires three parameters (e.g., $Phase_A$, $Phase_B$, $Phase_C$). The inputs also include an optional neutral connection and other optional connection(s) (e.g., digital input, digital output, analog input, analog output, etc.) that may or may not be used depending on the application. As shown, IED 402 provides the relevant data to be analyzed in accordance with embodiments of the present disclosure. The three representative values (e.g., $Phase_A$, $Phase_B$, $Phase_C$) flowing in a three-phase electrical system, such as shown in FIG. 4, are the "group of three" synchronously acquired values (e.g., $Value_1$, $Value_2$, $Value_3$) that make up a sample (e.g., $Sample_1$). It is important to note that these values may originate from a single acquisition or may be a composite of two or more of the same. For example, $Value_1$ may be a single value or an average of two or more values, each of the two or more values having its own synchronous timestamp. For example, the values provided in $Sample_1$ of TABLE I may be averaged with the respective values provided in $Sample_4$ (or any other sample if prudent) of TABLE I if it is determined to be a prudent approach to filter non-typical readings or for some other reason.

TABLE I

| | | Example Data Table. | | | |
|---|---|---|---|---|---|
| Set # | Sample # | Timestamp | $I_A$ | $I_B$ | $I_C$ |
| 1 | 1 | Aug. 14, 2023, 12:36:16:01 | 54 Amps | 53 Amps | 48 Amps |
| | 2 | Aug. 14, 2023, 12:41:16:00 | 43 Amps | 49 Amps | 49 Amps |
| | 3 | Aug. 14, 2023, 12:46:15:58 | 48 Amps | 43 Amps | 43 Amps |
| 2 | 4 | Aug. 14, 2023, 13:01:00:11 | 54 Amps | 48 Amps | 48 Amps |
| | 5 | Aug. 15, 2023, 13:06:00:07 | 48 Amps | 48 Amps | 48 Amps |
| | 6 | Aug. 15, 2023, 13:11:00:09 | 53 Amps | 43 Amps | 43 Amps |
| 3 | 7 | Aug. 16, 2023, 08:15:00:00 | 51 Amps | 52 Amps | 52 Amps |
| | 8 | Aug. 16, 2023, 08:30:00:01 | 49 Amps | 44 Amps | 44 Amps |
| | 9 | Aug. 16, 2023, 08:45:00:00 | 52 Amps | 46 Amps | 46 Amps |
| . . . | . . . | . . . | . . . | . . . | . . . |

For the purposes of this application and as shown in FIG. 5, the sample (e.g., $Sample_1$) from IED 402 is the synchronous (or pseudo-synchronous) acquisition of three representative values (averaged or not averaged). Because the values that compose the samples are synchronous in this embodiment, they have identical or similar acquisition timestamps. As shown in FIG. 5, a multiple of three acquired samples is referred to herein as a set (e.g., $Set_1$), which is generally required for analysis. The multiple of three acquired samples that compose one or more sets are not synchronous with each other because a requirement is to analyze different conditions that occur at different times, as each sample does. Algorithms embodying aspects of the present disclosure are able to leverage the data generally indicated 502 to provide unbalance analyses and results.

In an embodiment, samples to be analyzed for unbalance are, for example, based on current values (e.g., $I_A$, $I_B$, $I_C$). Alternatively, the samples to be analyzed for unbalance use, for example, may be apparent power values (e.g., $S_A$, $S_B$, $S_C$). Finally, the samples to be analyzed for unbalance, for example, may be voltage values. It is to be understood that all values used in a sample are analogous; not disparate. For example, a sample (e.g., $Sample_1$) does not consist of two current values (e.g., $Value_1$, $Value_2$) and one voltage value (e.g., $Value_3$) or a real power value (e.g., $Value_1$) and two apparent power values (e.g., $Value_2$, $Value_3$) or any other mixing of parameters. To do so would produce irrational and nonsensical results.

TABLE I illustrates three data sets: $Set_1$ (Samples 1, 2, 3), $Set_2$ (Samples 4, 5, 6), and $Set_3$ (Samples 7, 8, 9). TABLE I also provides the values (e.g., $I_A$, $I_B$, $I_C$) that compose the samples. It is important to note that any number of sets, samples and/or values may be considered.

FIG. 5 illustrates the relationship between data, sets, samples, values, and averaged values in accordance with one or more embodiments. "Data" in the shaded circle may include all the sets, samples, values, and averaged values acquired by at least one IED (i.e., IED 402 in this example). In general, a value is a single parameter that has been acquired by an IED, gateway, edge/head-end software, and/or cloud-based application. This includes direct electrical acquisitions (e.g., voltage, current, etc.), values derived from the directly acquired electrical data (e.g., real power, apparent power, etc.), I/O data (e.g., a load(s) operational status, temperature from a thermocouple, etc.), or any other relevant data associated with a load, process, IED (e.g., meter), gateway, edge/head-end software, and/or cloud-based application.

As previously stated, a set (e.g., $Set_1$) is composed of at least three samples (e.g., $Sample_1$, $Sample_2$, $Sample_3$) that are analogous parameters (e.g., currents in TABLE I). These three samples, which compose a set, are not synchronous with each other (i.e., they are not acquired at the same time) in the embodiment of TABLE I. The three values shown at the top of FIG. 5 that make up $Sample_1$ (i.e., $Value_1$, $Value_2$, $Value_3$), for example, may be $I_A$, $I_B$, and $I_C$ that were acquired at a first time (e.g., $t_1$) either synchronously with each other. Likewise, the second sample (e.g., $Sample_2$) includes the same parameters (i.e., $I_A$, $I_B$ and $I_C$) that were acquired at a second time (e.g., $t_2$) either synchronously with each other. Finally, the third sample (e.g., $Sample_3$) includes the same parameters (i.e., $I_A$, $I_B$ and $I_C$) that were acquired at a third time (e.g., $t_3$) either synchronously with each other.

FIG. 5 also illustrates the minimum number of values required (i.e., nine) to produce a set. As stated above, it is possible to include additional values into the analysis by averaging respective values. For example, $Sample_1$ may consist of six measurements where each value (e.g., $Value_1$, $Value_2$, $Value_3$) is an average of two acquisitions. Likewise, a set (e.g., $Set_1$) may consist of six samples where each of the samples (e.g., $Sample_1$, $Sample_2$, $Sample_3$) is an average of two samples. It is important to note that unbalance in a three-phase system requires data from each of the three phases to analyze; hence, the requirement for three values. Uniformly averaging these values is acceptable if the parameters directly correspond (e.g., $I_A$ is averaged with $I_A$ to achieve $Value_1$, $I_B$ is averaged with $I_B$ to achieve $Value_2$, and $I_C$ is averaged with $I_C$ to achieve $Value_3$).

There may be more than three samples available, but only multiples of three samples can be used to analyze the unbalance. While any three samples (or multiple of three samples) may be analyzed together, it is generally more prudent or useful to purposefully consider samples that have some significance with each other. A few examples include: 1) using three samples taken at different times of day, 2) using three samples while different downstream processes are operating, or 3) using three samples when similar processes are in use at different times of the day, for example. Having such context as is given in these examples helps to better interpret and understand the results of the analysis.

As an additional note, there are various mathematical approaches that can be taken to calculate the number of sets available in a database containing n samples. One approach may be using combinatorial mathematics to calculate the number of possible sets from three unique combinations of samples using the following equation:

$$\text{\# of Unique Set Combinations}(y) = \qquad\qquad \text{(Eqn. 4)}$$

$$C((x), r) = \binom{x}{r} = \frac{xPr}{r!} = \frac{(x)!}{r!\,(x-r)!}$$

where x is the total number of samples that can be analyzed, r is a multiple of three, and $x \geq r \geq 3$.

For example, assume there are 577 total samples available for analysis, therefore, x=577. To determine the values of r that may be considered (i.e., multiples of 3 and $x \geq r \geq 3$). The number of unique set combinations can then be determined by using Equation 4:

$$\text{\# of Unique Set Combinations}(y) = \binom{577}{3} = \frac{577!}{3!\,(577-3)!} = 31{,}850{,}400$$

where the set population x is 577, and the sample set r is 3.

As stated above, it is possible to average two readings to produce one value (e.g., $Value_1$). In this case, the number of unique set combinations can then be determined by using Equation 4:

$$\text{\# of Unique Set Combinations}(y) =$$

$$\binom{577}{6} = \frac{577!}{6!\,(577-6)!} = 49{,}933{,}980{,}576{,}480$$

where the set population x is 577 and the sample set r is 6.

Although averaging data is feasible and relevant, the most straightforward approach involves using only three values per sample and three samples per set. Additionally, the output of the analyses, which is a derived parameter, may be stored, logged, trended, further analyzed, displayed, alarmed upon, emailed, etc. Unbalance may be calculated using either phase-to-phase data or phase-to-neutral data; however again, the parameters used must be consistent. All data may be supplemented with operational status data (e.g., I/O, etc.), spatial relationships, and so forth, to provide better context for the unbalance assessment (severity, source location, etc.).

Once the data to be analyzed has been identified and/or established (e.g., sets, samples, values, averaged values, etc.), an algorithm is used to analyze the identified/established parameter's unbalance across the three phases. The first step in analyzing the unbalance at an IED's location is to create an analysis matrix from the identified and/or established values. TABLE II illustrates a simple example data set that is an abridged version of TABLE I. In this instance, only the first data set (e.g., $Set_1$) is considered.

TABLE II

Simple Example Data Set.

| Set # | Sample # | Timestamp | $I_A$ | $I_B$ | $I_C$ |
|---|---|---|---|---|---|
| 1 | 1 | Aug. 14, 2023, 12:36:16:01 | 54 Amps | 53 Amps | 43 Amps |
| | 2 | Aug. 14, 2023, 12:41:16:00 | 41 Amps | 49 Amps | 49 Amps |
| | 3 | Aug. 14, 2023, 12:46:15:58 | 48 Amps | 43 Amps | 42 Amps |

In TABLE II, a first reading is taken by IED 402 on Aug. 14, 2023 at 12:36:16:01 for the $I_A$, $I_B$, and $I_C$ currents (i.e., $Value_1$, $Value_2$, and $Value_3$). Approximately five minutes later, a second reading is taken by the same IED 402 at 12:41:16:00 for the $I_A$, $I_B$, and $I_C$ currents (i.e., $Value_4$, $Value_5$, and $Value_6$). A third reading is taken about five minutes later at 12:46:15:58 for the $I_A$, $I_B$, and $I_C$ currents (i.e., $Value_7$, $Value_8$, and $Value_9$). The first three values create the first sample (i.e., $Sample_1$), the second three values create the second sample (i.e., $Sample_2$), and the third three values create the third sample ($Sample_3$). All three samples (i.e., $Sample_1$, $Sample_2$, and $Sample_3$) create a first set (i.e., $Set_1$).

TABLE III illustrates a general form of TABLE II, replacing the measured values with variables in each respective cell of the matrix. The variables are unique and are designated with two-digit subscripts. The first subscript number indicates the cell's row number and the second subscript number indicates the cell's column number. For example, the cell located on the second row (m) and in the third column (n) is the variable $a_{23}$. The matrix dimensions of the variables are m rows by n columns, so the matrix is an m×n matrix (a 3×3 matrix in this example).

TABLE III

General Model of Data in TABLE II.

| Set # | Sample # | Timestamp | $I_A$ | $I_B$ | $I_C$ |
|---|---|---|---|---|---|
| 1 | 1 | $t_1$ | $a_{11}$ | $a_{12}$ | $a_{13}$ |
| | 2 | $t_2$ | $a_{21}$ | $a_{22}$ | $a_{23}$ |
| | 3 | $t_3$ | $a_{31}$ | $a_{32}$ | $a_{33}$ |

Each row of the set is a discrete or averaged sample of three values acquired at a synchronous time. In an embodiment, each averaged reading that composes an averaged sample is not synchronous. Additionally, each column of the set is a single parameter (i.e., phase magnitude in this case) acquired at three unique moments in time. Each matrix cell provided in TABLE III is also equivalent the following values discussed above: $a_{11}=Value_1$, $a_{12}=Value_2$, $a_{13}=Value_3$, $a_{21}=Value_4$, $a_{22}=Value_5$, $a_{23}=Value_6$, $a_{31}=Value_7$, $a_{32}=Value_8$, and $a_{33}=Value_9$. This is important because the algorithm embodying aspects of the present disclosure manipulates the matrix to analyze the unbalance at the unique location where the values are acquired.

Figure 6:
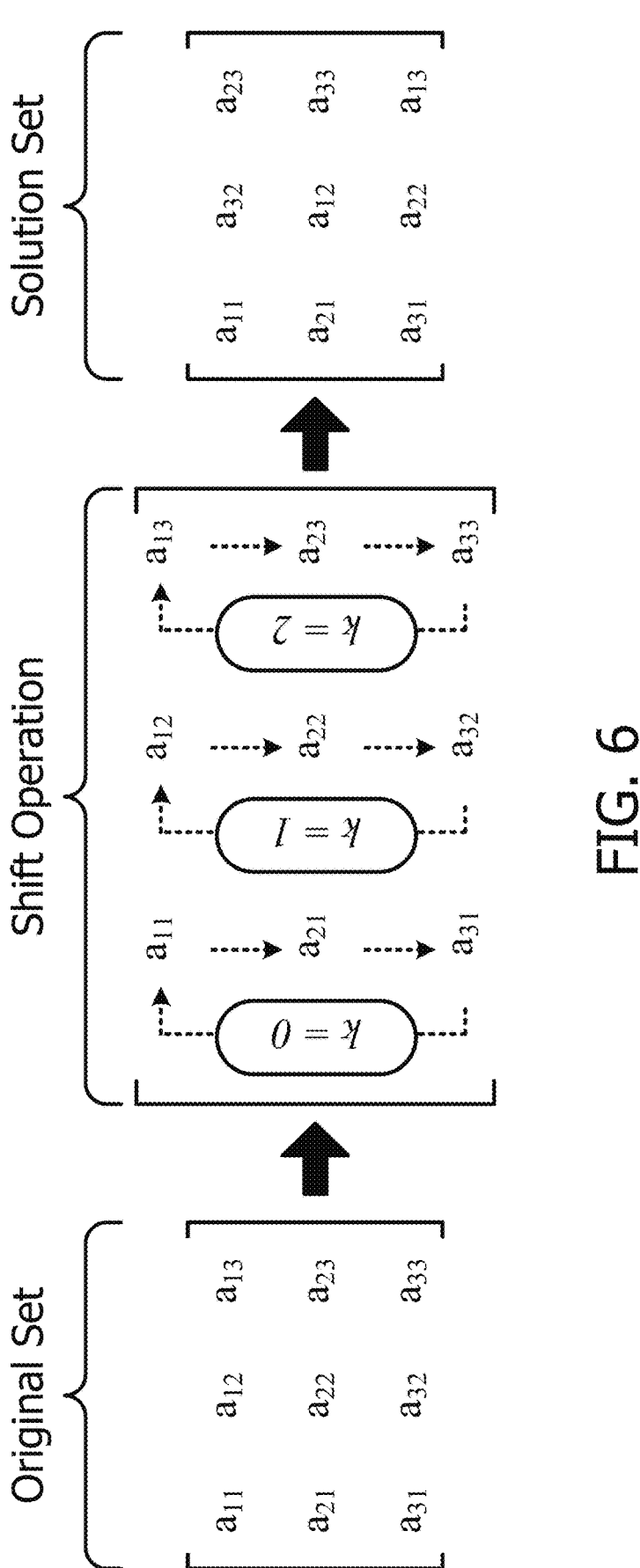
FIG. 6 illustrates a matrix shift operation for analyzing unbalance in accordance with embodiments of the disclosure.

FIG. 6 illustrates a matrix shift operation for analyzing unbalance by creating a new solution set (herein referred to as Step 1 of the analysis). The new solution set is then evaluated in future steps to determine the location (i.e., upstream or downstream from IED 402) and severity of a given parameter's (e.g., current, apparent power, etc.) unbalance. This approach may be used for single values, averaged values, or averaged sets, assuming any averaging occurs before the values are entered into the matrix cells.

The "original set" shown in FIG. 6 is the same data array as shown in TABLES I, II, and III; the individual matrix cells (e.g., $a_{11}$, $a_{12}$, etc.) shown in TABLE III correspond directly with those shown in the original set in FIG. 6. As previously mentioned, each row of the original set corresponds with discrete or averaged readings that compose the three values. Additionally, each column of the original set is a single parameter (e.g., $I_A$, $I_B$, and $I_C$, respectively) acquired at three unique moments in time.

The first step (Step 1) is manipulating the original set to shift two of the columns down (or up) in such a way that no two values in any row are part of the same (original) sample. For example, one exemplary technique is by shifting each column down by k steps is indicated in FIG. 6, where k=n−1 and n is the column number. For example, in the first column n=1; therefore, because the result of k=1−1=0, there will be no shift. Likewise, in the second column n=2, so k=2−1=1, so column 2 will experience a single step shift. Finally, in the third column n=3, so k=3−1=2, so column 3 will experience a two-step shift. In this approach, each column is shifted to ensure that no two values from any original row are still in the same row together. To be clear, this approach may be augmented or other equations may be used to shift the columns so that no two values from any original row are still in the same row together (e.g., k=/n−3/, etc.). Although described in the context of a column shift, it is to be understood that other approaches to shifting, such as a row shift, are within the scope of the present disclosure.

Figures 7A, 7B:
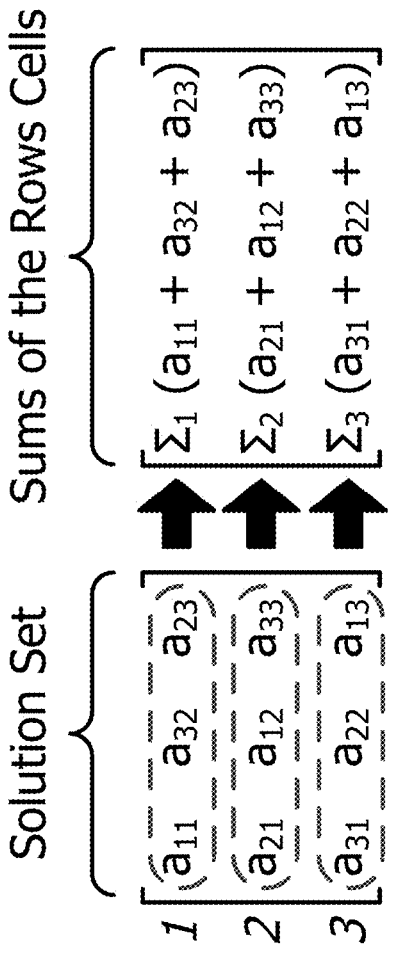
FIG. 7A shows an arithmetic addition of each discrete row and FIG. 7B shows an arithmetic addition of each discrete column in accordance with embodiments of the disclosure.

The next step (i.e., Step 2) to analyze the results of the solution set is by performing a simple arithmetic addition of the rows and columns, respectively. FIGS. 7A and 7B illustrate this approach using the matrix cells given in the solution set of FIG. 6. FIG. 7A shows the arithmetic addition of each discrete row (total of row cells) to construct a first analysis set, and FIG. 7B shows the arithmetic addition of each discrete column (total of column cells) to construct a second analysis set. To expound, the sums of the rows in FIG. 7A produces a fourth column (i.e., 3×1 array) from these arithmetic additions, and the sums of the columns in FIG. 7B produces a fourth row (i.e., 1×3 array) from these arithmetic additions.

Subsequent to the steps shown in FIGS. 7A and 7B (Step 2), the third step (Step 3) calculates the mean (average) value of the new column ($\overline{\Sigma_{123}}$) and row ($\overline{\Sigma_{ABC}}$) from Step 2, respectfully. The equation for the mean value of the new total of row cells column ($\overline{\Sigma_{123}}$) is given as follows:

$$\overline{y_{123}} = \overline{\sum\nolimits_{123}} = \overline{\left(\sum\nolimits_1 + \sum\nolimits_2 + \sum\nolimits_3\right)} \qquad \text{(Eqn. 5)}$$

and the equation for the mean value of the new total of columns row ($\overline{\Sigma_{ABC}}$) is given as follows:

$$\overline{y_{ABC}} = \overline{\sum\nolimits_{ABC}} = \overline{\left(\sum\nolimits_A + \sum\nolimits_B + \sum\nolimits_C\right)} \qquad \text{(Eqn. 6)}$$

Upon the completion of Step 3, all variables are available to calculate both the source of unbalance and the magnitude of the unbalance from the respective source(s).

The final step (Step 4) is to calculate the unbalance associated with the load(s) (i.e., downstream from the IED) and the source(s) (i.e., upstream from the IED), respectively. To calculate the unbalance effect associated with the load(s), an equation similar to the NEMA/IEEE Unbalance Definition above may be used:

$$\% \text{ Load(s) Source Unbalance} = \qquad \text{(Eqn. 7)}$$

$$\frac{\text{Max}\left(\sum\nolimits_1, \sum\nolimits_2, \sum\nolimits_3\right) - \text{Min}\left(\sum\nolimits_1, \sum\nolimits_2, \sum\nolimits_3\right)}{\sum\nolimits_{123}} \times 100$$

Additionally, to calculate the unbalance effect associated with the source(s), an equation similar to the NEMA/IEEE Unbalance Definition above may also be used:

$$\% \text{ Supply(s) Source Unbalance} = \qquad \text{(Eqn. 8)}$$

$$\frac{\text{Max}\left(\sum\nolimits_A, \sum\nolimits_B, \sum\nolimits_C\right) - \text{Min}\left(\sum\nolimits_A, \sum\nolimits_B, \sum\nolimits_C\right)}{\sum\nolimits_{ABC}} \times 100$$

Analyzing and comparing the results from both equations from Step 4 is useful from many respects, and the conclusions from these analyses will depend upon the parameters being evaluated. Additionally, specific parameters may have distinctive thresholds/limits and unique evaluations. The results from Equations 7 and 8 will indicate the relative source(s) of unbalance, allowing the end-user to address any issue accordingly. If the load-side of the acquisition point (i.e., IED location) is a significant source of unbalance, the end-user may able to address the issue by focusing downstream from this point (e.g., IED). If the downstream load(s) are thought to be primarily balanced three-phase load(s), then exceeding a given threshold (e.g., 10%) would indicate there may be a three-phase load issue (e.g., shorted windings in a faulty motor stator, excessive eccentricity, rotor bar issues, etc.). If the downstream loads are a mix of single-phase loads and three-phase loads, further investigation may be required. Incorporating digital and/or analog I/O (e.g., digital status output from a motor) provides beneficial information for any investigation to better understand how the operational status(es) of equipment/load(s) correlate with and/or impact the unbalance.

If the source-side of the acquisition point (i.e., IED location) exhibits significant unbalance, the end-user may be able to address the issue by focusing upstream from this point (e.g., IED 402). Upstream source(s) should be relatively balanced across the three phases, so exceeding a given threshold (e.g., 10%) would indicate improving the source(s) balance should be considered. The load(s) on parallel circuit(s) or on utility source(s) are generally a mix of single-phase loads and three-phase loads. Because source unbalance generally propagates further into the electrical system due to increasing impedances, it is important to maintain load balancing from the source to minimize creating or exacerbating an unbalance issue. Again, incorporating digital and/or analog I/O (e.g., digital status output from a motor) provides beneficial information for any investigation to better understand how the operational status(es) of system equipment/load(s) correlate with and/or impact the unbalance.

According to one or more embodiments, processing the energy-related signals acquired over time by at least one IED 402 permits characterizing electrical unbalance between a plurality of conductors to identify an electrical unbalance across them and to determine the extent, including contributions, of electrical sources to the identified electrical unbalance condition and/or to determine the extent, including contributions, of loads in the electrical system to the identified electrical unbalance condition. Aspects of the present disclosure can be usefully applied anywhere within an electrical system, including utility substation buses, select locations along utility distribution feeder circuits, adjacent to important three-phase utility equipment, adjacent to the PCC (point-of-common-coupling) or on the end-user's main, adjacent/just upstream from important three-phase end-user loads, and so forth. Advantageously, determining the extent of contribution of one or more electrical sources, and the extent of contribution of one or more loads in the electrical system, to the identified electrical unbalance condition permits providing an indication, identifying an action, taking an action, and/or optimizing an action associated with the analysis result.

The following two examples further illustrate aspects in accordance with one or more embodiments:

Example 1—Discrete Application

Figure 8:
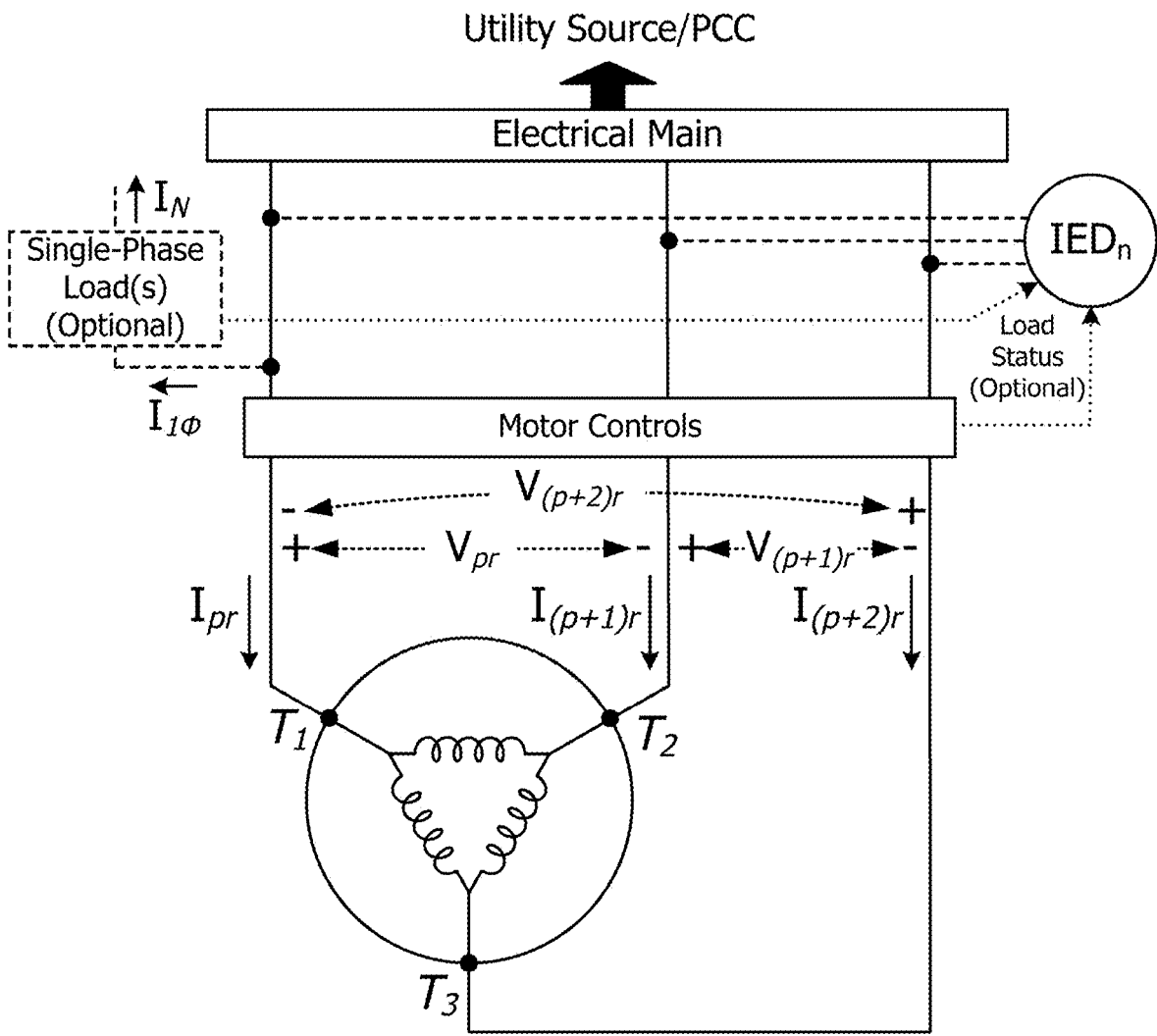
FIG. 8 is a schematic diagram illustrating an example of a system with three-phase and single-phase loads in accordance with embodiments of the disclosure.

An IED is installed on an end-user's small electrical system at the main electrical entrance to shadow the utility's billing meter as shown in FIG. 8, which is an exemplary simple three/single-phase system. In this example, the electrical system includes both single-phase and three-phase loads, and optionally includes I/O data from one or more of the end-user loads. The IED acquires three samples from each phase (i.e., nine total values) of three-phase current data over approximately a 10-minute period, provided in the simple example data set shown in TABLE II above.

Figure 9A:
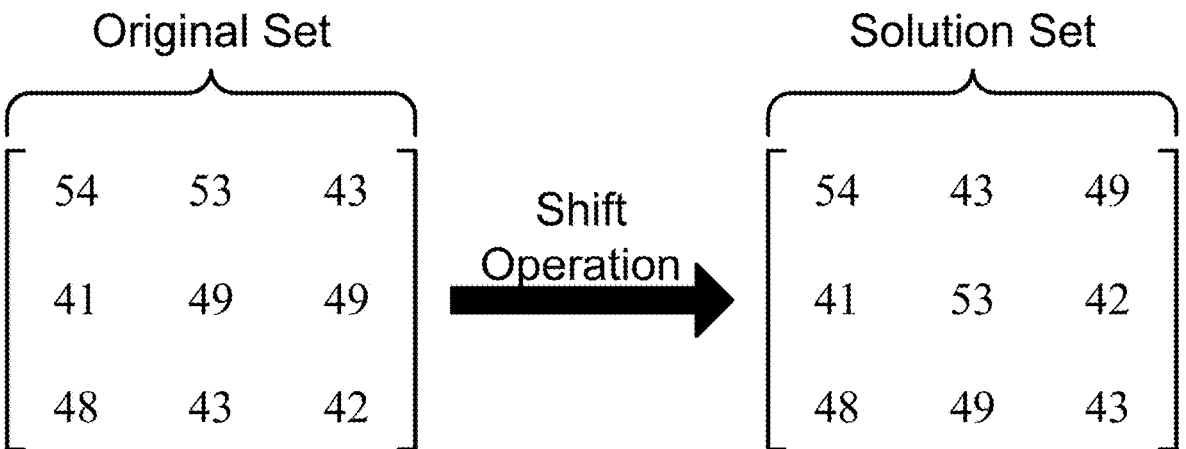
FIG. 9A and FIG. 9B illustrate the development of solution sets after performing a shift operation in accordance with examples and embodiments of the disclosure.

The first step (Step 1) is to perform the shift operation to construct a solution data set from the original data set. FIG. 9A illustrates the creation of a solution set for Example 1 (Step 1), showing the original set and the resulting solution set after performing the shift operation on the matrix's contents as described above with respect to FIG. 6.

Figure 9B:
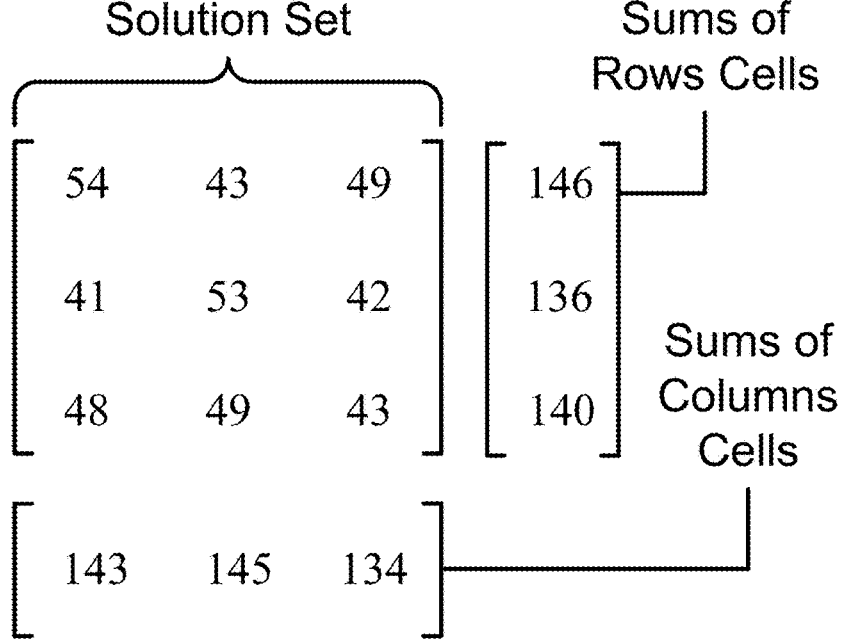

The second step (Step 2) is to perform an arithmetic addition of the rows and columns, respectively, as shown in FIGS. 7A and 7B. The results of this example's additions are provided in FIG. 9B, which illustrates Sums of Rows and Columns Cells for Example 1 (Step 2).

The third step (Step 3) is to calculate the mean (average) value of the new sums of the columns and the sums of the rows using Equations 5 and 6. The mean of the sums of the rows is equal to $\overline{(146+136+140)}=140.\overline{6}$, and the mean of the sums of the column is equal to $\overline{(143+145+134)}=140.\overline{6}$.

The final step (Step 4) is to calculate the unbalance associated with the load(s) (i.e., downstream from the IED) and the source(s) (i.e., upstream from the IED) using Equations 7 and 8, respectively.

17

Equation 7 provides the following:

$$\% \text{ Load(s) Source Unbalance} =$$
$$\frac{\text{Max}(146, 136, 140) - \text{Min}(146, 136, 140)}{140.\overline{6}} \times 100 = 7.11\%,$$

which indicates that the current unbalance associated with the load(s) is 7.11%.

Similarly, Equation 8 provides the following:

$$\% \text{ Supply(s) Source Unbalance} =$$
$$\frac{\text{Max}(143, 145, 134) - \text{Min}(143, 145, 134)}{140.\overline{6}} \times 100 = 7.11\%,$$

which indicates that the current unbalance associated with the source(s) is also 7.11%.

Because both the supply(s) source and load(s) source results are less than 10% in this example, the current unbalance from both would be considered reasonable and an action would be to continue periodic evaluation to ensure the threshold is not subsequently exceeded. It may also be recommended to install three-phase metering closer to any critical three-phase load(s) to better understand the unbalance at those locations. Finally, the optional I/O data may be useful to infer the interactions of single-phase and three-phase loads as they relate to unbalance over the range of operation.

Example 2—Discrete Application

Figure 10A:
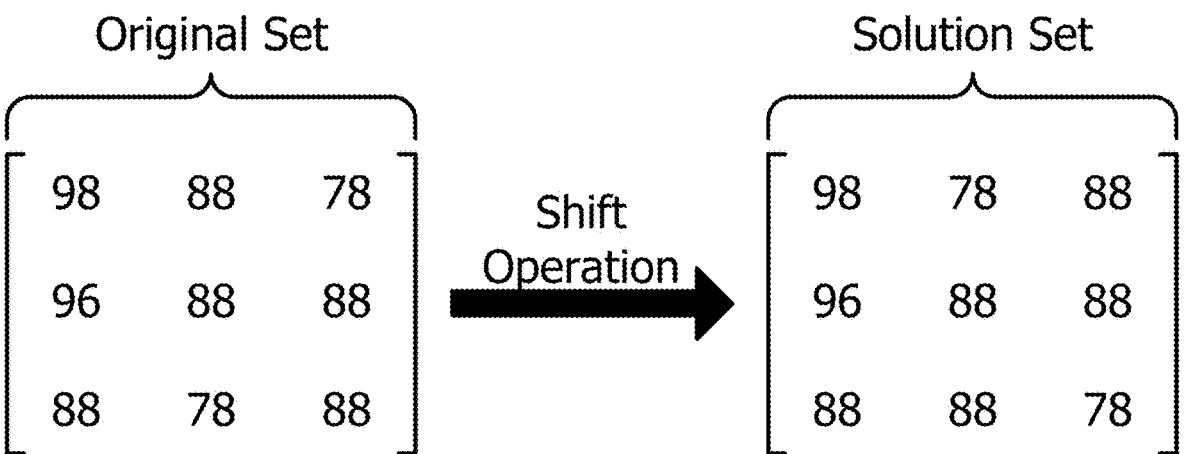
FIG. 10A and FIG. 10B illustrate the development of solution sets after performing a shift operation in accordance with examples and embodiments of the disclosure.
Figure 10B:
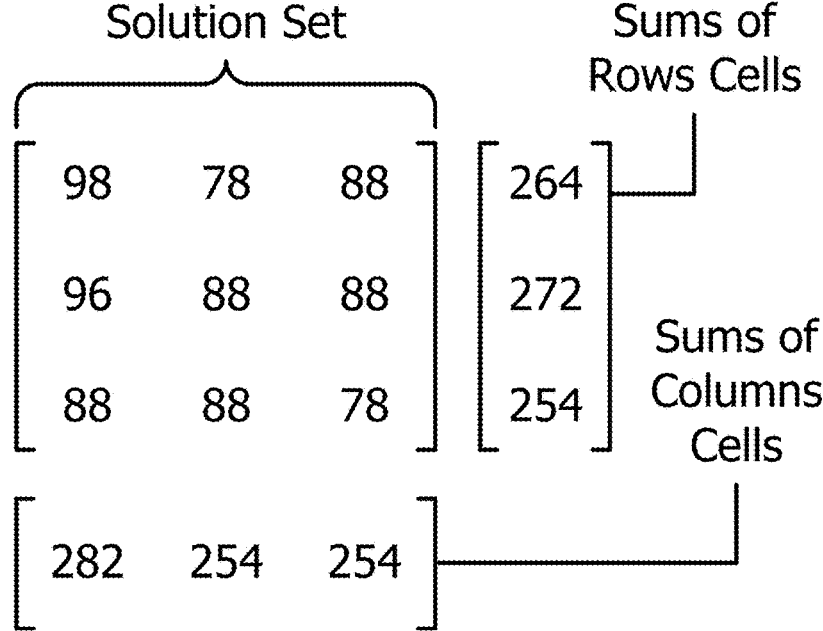

An IED is installed just upstream from a three-phase load as shown in FIG. 10 relating to Example 2. The IED acquires three samples from each phase (i.e., nine total values) of the three-phase apparent power data over about a 20-minute period, provided in the simple example data set shown in TABLE IV.

TABLE IV

| Example Data Set for Example 2. | | | | | |
|---|---|---|---|---|---|
| Set # | Sample # | Timestamp | SA | SB | SC |
| 1 | 1 | Aug. 28, 2023, 16:54:22:11 | 98 kVA | 88 kVA | 78 kVA |
| | 2 | Aug. 28, 2023, 17:04:22:13 | 96 kVA | 88 kVA | 88 kVA |
| | 3 | Aug. 28, 2023, 17:14:21:59 | 88 kVA | 78 kVA | 88 kVA |

Figure 11A:
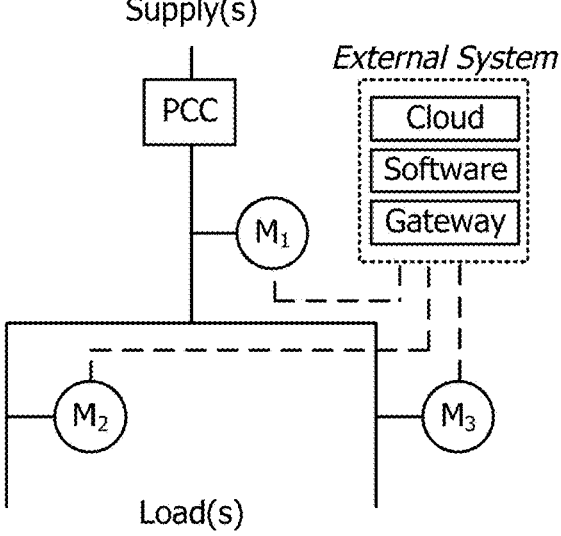
FIGS. 11A to 11C illustrate exemplary electric power management systems (EPMSs) identifying a location of unbalanced conditions in accordance with the examples and embodiments of the disclosure.

Again, the first step (Step 1) is to perform the shift operation to construct a solution data set from the original data set. FIG. 11A illustrates the shift operation to create a solution set (Step 1), showing the original set and the resulting solution set after performing the shift operation on the matrix's contents as described in FIG. 6 above.

Figure 11B:
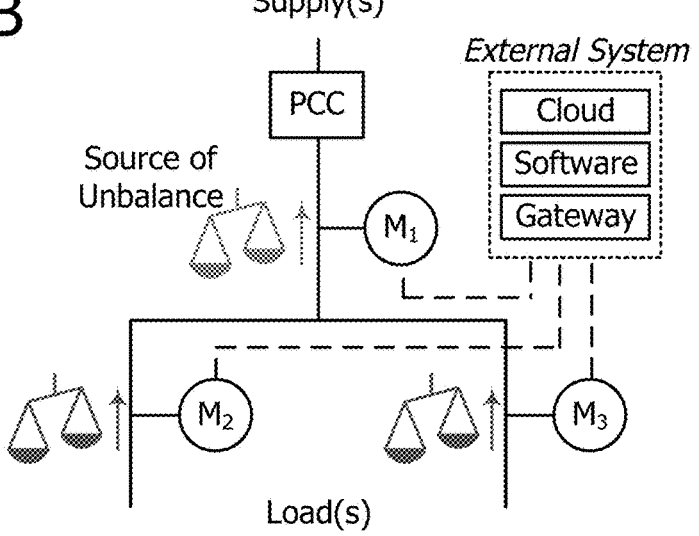
Figure 11C:
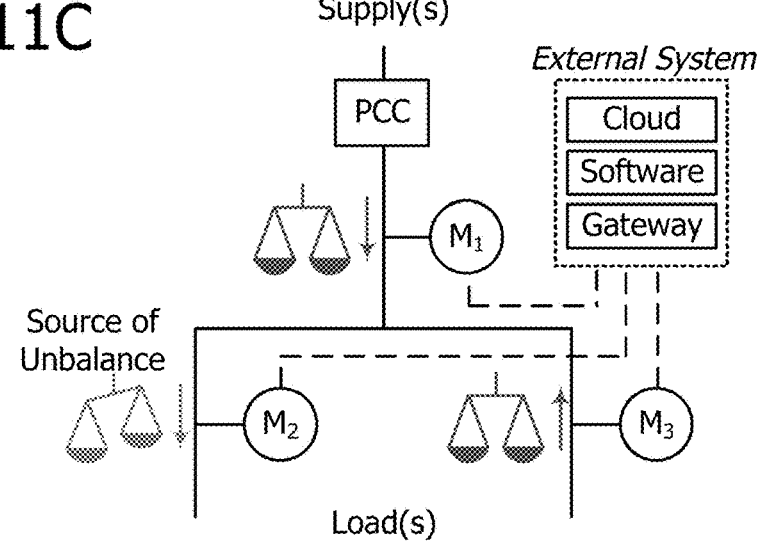

The second step (Step 2) is to perform a simple arithmetic addition of the rows and columns, respectively, as shown in FIGS. 7A and 7B. The results of this example's additions are provided in FIG. 11B, which shows sums of rows and columns cells for Example 2 (Step 2).

The third step (Step 3) is to calculate the mean (average) value of the new sums of the columns and the sums of the rows using Equations 5 and 6. The mean of the sums of the

18 rows is equal to $\overline{(264+272+254)}=263.\overline{3}$, and the mean of the sums of the column is equal to $\overline{(282+254+254)}=263.\overline{3}$.

The final step (Step 4) is to calculate the unbalance associated with the load(s) (i.e., downstream from the IED) and the source(s) (i.e., upstream from the IED) using Equations 7 and 8, respectively.

Equation 7 provides the following:

$$\% \text{ Load(s) Source Unbalance} =$$
$$\frac{\text{Max}(264, 272, 254) - \text{Min}(264, 272, 254)}{263.\overline{3}} \times 100 = 6.84\%,$$

which indicates that the current unbalance associated with the load(s) is 6.84%.

Similarly, Equation 8 provides the following:

$$\% \text{ Supply(s) Source Unbalance} =$$
$$\frac{\text{Max}(282, 254, 254) - \text{Min}(282, 254, 254)}{263.\overline{3}} \times 100 = 10.63\%,$$

which indicates that the current unbalance associated with the source(s) is also 10.63%.

Because the supply(s) source unbalance result is greater than 10% in this example, one or more actions should be considered to address/mitigate the apparent power unbalance from the supply(s) side of the IED. For instance, one or more of the following actions may be taken with this issue:

Providing voltage regulation using regulators or DVRs upstream from the IED,
  Balancing single-phase loads upstream from the IED,
  Addressing any other adjacent load issues,
  Derating the motor,
  Contacting the utility to check for issues from the source (e.g., capacitor bank fuses, unbalanced lateral feeders, etc.), and/or
  Other approaches to reduce voltage and/or current unbalance.

Any improvements to the source voltage or current unbalance will result in unbalance improvements for the downstream load(s) as well. It is important to recheck the unbalance at the IED after taking any steps to address/mitigate the issue to ensure ancillary issues are not created.

System View of Unbalance Using Three-Phase Current and Power Data

Another method to evaluate/analyze electrical unbalance is from a system perspective. The majority of electric monitoring systems use two or more IEDs, etc. to collect electrical data, and many modern IEDs (e.g., meters, etc.) are able to acquire voltage, current, apparent power, real power, energy, etc. data for each phase in a three-phase system. The IED(s) may be connected (directly or indirectly) to a common external point(s) that are able to accumulate, aggregate, store, process, analyze, alarm, interact, control, or perform any other benefits for the end-user. If three phases of data are available from the IED(s), it is possible to process unbalance severity(ies) and source(s) at these external point(s) that are remote from an IED (e.g., gateway, edge software, cloud-based application, etc.) by leveraging the discrete unbalance approach described above. It is also feasible to pass processed unbalance data (i.e., in lieu of raw parameter data) directly to the external point(s) for display, storage, alarming, or some other purpose. The entire system (i.e., internal and external) are referred to herein as an EPMS.

FIG. 12A illustrates a simple EPMS with three IEDs (i.e., $M_1$, $M_2$, $M_3$) optionally connected to at least one external/remote point as described above. As shown, the utility electric supply(s) are positioned on the top of the circuit and the loads are positioned on the bottom of the circuit. The PCC (point-of-common coupling) denotes the boundary between the utility supply and the end-user's systems, and is typically determined by the utility billing meter's location. This system is a radial-fed system (i.e., unidirectional) meaning that the energy flows from top (i.e., the source) to the bottom (i.e., the loads); not in the reverse direction. FIG. 12A shows each IED (i.e., $M_1$, $M_2$, and $M_3$) directly connected to the external point; however, one or more of the IEDs may also be indirectly connected as well. Additionally, an IED may be connected to an external point, which in turn is connected to another external point that performs processing and/or assessment of the unbalance data. For example, an IED may be directly connected to a gateway, which performs some processing and/or assessment. This gateway may be connected to the head-end/system software or even a cloud-based application, which also perform some processing and/or assessment.

It may be important for one or more external points to be properly configured to perform the relevant processing and/or assessment of the data. For example, PC-based logging may be used by the head-end system to capture unbalance data at some regular interval (e.g., 1-minute, 5-minute, daily, weekly, monthly, etc.), depending on the application or need. Another configuration parameter may be setting proper thresholds to allow important unbalance issues to be identified while filtering out less relevant information (e.g., alarm optimization or prioritization). When evaluating a system of IEDs, configuration (either automatically or manually) may include identifying the placement and/or interrelationship of IEDs with respect to each other. The interrelationships of IEDs are useful for locating (e.g., triangulating) the source(s) of unbalance issue(s) during troubleshooting, evaluating probabilities associated with the location(s) of unbalance source(s), determining the best locations for mitigating the unbalance issue(s), and/or understanding the ROI (return on investment) of expenditures related to unbalance problem mitigation. There are many other reasons for configuring a system that will be understood by someone with ordinary skill in the art.

When comparing data from discrete IEDs, it is important to ensure the data to be analyzed from a first IED is synchronously (or pseudo-synchronously) sampled with respect to the data from a second IED (or third IED, etc.). Moreover, other inputs to the analyses may have time relevancy (e.g., I/O data, etc.) and should be synchronously (or pseudo-synchronously) acquired, at least within the same duty cycle of the equipment being compared. That is, similar load type(s) and load magnitude(s) should be considered. It is possible that acquired data from two or more IEDs may not be precisely temporally aligned; however, issues arising from imprecise synchronicity may be statistically mitigated over time.

To illustrate a system approach to analyzing unbalance, two examples are provided below. It is important to note that the examples provided are just two of an innumerable number of possibilities and/or considerations based on any number of parameter(s), hierarchy(ies), IED type(s), IED number(s), IED capability(ies), data acquisition rate(s), configuration(s), external system(s), unbalance source(s), radial or non-radial electrical system(s), load characteristics, and so forth.

Example 3—System Application

FIG. 12B illustrates a system diagram for the third example herein, which is an EPMS similar to the one shown in FIG. 12A. At least one external system (e.g., gateway, head-end/edge software, cloud-based application, etc.) is connected to two or more IEDs. Relevant data is acquired from the IEDs and passed (i.e., communicatively coupled by some means or method) to the external system. As mentioned above, processing of the unbalance parameter(s) may be performed at the IEDs, in the external system, or some combination thereof. Spatial context (i.e., how IEDs interrelate within the metering hierarchy) is generally a useful consideration when evaluating the effects of unbalance across an EPMS.

In Example 3, raw data from each of the three IEDs (i.e., $M_1$, $M_2$, $M_3$) is analyzed either within the discrete IED, within the external system, or some combination thereof. For example, Meters $M_1$ and $M_2$ may analyze the unbalance data within each discrete IED, respective; however, raw data from Meter $M_3$ may be analyzed in the head-end software managing the EPMS. Once the analyses are completed for each IED and communicated to, and aggregated at, a central point (e.g., the edge/head-end software), the unbalance results are considered through their spatial (i.e., locational) context. In this example, data from all three IEDs (i.e., $M_1$, $M_2$, $M_3$) indicates the source of the unbalance as upstream from each respective IED, as signified by the shaded scales and arrows. In particular, the scale and arrow adjacent to Meter $M_1$ indicate the IED closest to the unbalance source, specifically, the utility supply(s). The scales and arrows adjacent to Meters $M_2$ and $M_3$ also indicate unbalance as being upstream from each respective IED; however, neither is closest to the unbalance source. It should be noted that any color, symbol, figure, character, designator, or other representation may be similarly used. The benefit of this approach allows the end-user or utility to quickly identify relevant unbalance sources to more expediently monitor, assess, mitigate and/or resolve the issue accordingly.

Example 4—System Application

FIG. 12C illustrates a system diagram for the fourth example in this application and, like Example 3, is an EPMS similar to the one shown in FIG. 12A. Again, at least one external system (e.g., gateway, head-end/edge software, cloud-based application, etc.) is connected to two or more IEDs, and relevant data is acquired from the IEDs and passed (i.e., communicatively coupled by some means or method) to the external system. As before, processing of the unbalance parameter(s) may be performed at the IEDs, in the external system, or some combination thereof. Again, the spatial context (i.e., how IEDs interrelate within the metering hierarchy) is generally a useful consideration when evaluating the effects of unbalance across an EPMS.

In Example 4, raw data from each of the three IEDs (i.e., $M_1$, $M_2$, $M_3$) is again analyzed either within the discrete IED, within the external system, or some combination thereof. Meter $M_1$ may analyze the unbalance data within each discrete IED, respective; however, raw data from Meters $M_2$ and $M_3$ may be analyzed in the head-end software managing the EPMS. Once more, after the analyses are completed for each IED and communicated to, and aggregated at, a central point (e.g., the head-end software), the unbalance results are considered through their spatial (i.e., locational) context. In this example, data from two IEDs (i.e., $M_1$, $M_2$) indicates the source of the unbalance to be downstream and data from one IED (i.e., $M_3$) indicates the source of the unbalance to be upstream from each respective IED, as signified by the shaded scales and arrows. In this case, the scale and arrow adjacent to Meter $M_2$ indicate the IED closest to the unbalance source, specifically, a load(s). The scale and arrow adjacent to Meter $M_1$ indicates the unbalance source as being downstream and the scale and arrow adjacent to $M_3$ indicates the unbalance source as being upstream, respectfully. In concert as a group, the three IEDs indicate the unbalance source as being downstream from Meter $M_2$; consequently, mitigating action should be considered at load(s) below $M_2$ in the metering hierarchy. These action(s) may include balancing single-phase loads, repairing an unbalanced three-phase load(s), derating one or more downstream motors, improving voltage regulation in the system, or some combination thereof. Again, it should be noted that any color, symbol, numeral, figure, character, designator, or other representation may be similarly used.

Optional Steps

Upon completion of any analyses or assessments performed to determine unbalance of a parameter, other optional steps may be taken. For example, it may be important or necessary to store raw, processed, results, and/or recommendations data related to one or more analyses performed by this invention. This stored data may be used for historical analyses, process optimization, algorithm improvements, gap identification, or other analyses, statistics or improvements.

Historical analyses may include statistical tests and/or analysis(es) including trending of data, maximum deviation(s), standard deviation(s), correlation(s), linear regression(s), or any other statistical test known by a person of ordinary skill in the art. Each or any of these test(s) and/or analysis(es) may be run sequentially or concurrently according to necessity or choice. Analysis(es) may involve using real-time data, historical data, or a combination thereof. Any step within the process described above may be optionally stored for future use (e.g., solution sets, mean/average value of the new sums of the columns and the sums of the rows, % load unbalance, % current unbalance, etc.). Data may be stored as a percentage, rational or irrational number(s), absolute value, relative value or some other way. Additionally, other relevant data such as I/O information (e.g., status, temperatures, associated timestamps, etc.) may be stored to improve analysis(es) and/or assessments.

Alarm data from one or more IEDs or an external system may also be optionally stored for future consideration. Alarm data may include alarm occurrences, alarm severity(ies), alarm source location(s), alarm configurations (e.g., thresholds, changes, recommendations, etc.), alarm notification types, alarm sources (e.g., specific IEDs, external systems, etc.), and so forth.

Action(s) taken and/or information associated with action(s) taken either automatically or manually may be stored as well. For example, recommendations and/or actions to mitigate an unbalance issue may be saved for future consideration. Efforts to improve balancing, locations of those efforts within a hierarchy, and techniques/approaches used or considered may also be stored.

It is to be understood that one or more embodiments optionally use contextual information in formulating actions for assessing or addressing unbalances, such as:

Customer or segment type (e.g., data center, semiconductor manufacturer, industrial metal melting, general industrial, automobile manufacturer, utility provider, etc.), Load information—Type(s) (e.g., ASD/VSD, air compressor, servers, lighting, arc furnace, photo masking, etc.), nameplate data, relevant operational data, age, duty cycle, load profile, history, etc., System information—design, electrical infrastructure (e.g., cable type, cable number, transformer tap settings, transformer nameplate data, capacitor information, relays, breakers and protective devices, numbers and types of sources, flow schemes, etc., IED information—type(s), limitation(s), location(s), accuracy(s), etc., and/or.

Data synchronicity—temporal alignment of data sets between one or more IED, use of GPS time stamping, NTP/SNTP/PTP protocols, other techniques, etc.

Advantageously, aspects of the present disclosure permit non-technical personnel to more easily identify, assess, and resolve unbalance issues. It automatically filters less pertinent and/or more technical information while prioritizing the relevant data. Results are automatically provided without requiring any manual complex analysis(es). In some cases, statistical probabilities may be provided to help end-users better determine if/when any action should be taken. In an aspect, the disclosed process is able to operate as needed (e.g., continuously, periodically, randomly, etc.) to ensure the best results. Additionally, if load constraints are available, it is possible to determine the impact of unbalance on equipment life by leveraging historical unbalance data. Because aspects of the disclosure are applicable to any three-phase system (e.g., radial, non-radial, network, etc.), any energy consumer/customer type (e.g., utility, industrial, commercial, governmental, etc.) is able to benefit.

In an embodiment, a method for automatically assessing and responding to voltage unbalance impact associated with motors and other three-phase loads in an electrical system includes capturing energy-related data in the electrical system and analyzing or assessing the captured energy-related data to identify three-phase load changes (e.g., load energizations, de-energizations, load variations, etc.). The method also includes analyzing pre-event and post-event voltage unbalance data associated with the identified three-phase load changes to identify voltage unbalance changes. In response to identifying voltage unbalance changes, the method quantifies the voltage unbalance improvements or degenerations associated with the three-phase load change as well as effects of the motors and other three-phase loads on the electrical system's voltage unbalance. The method further includes analyzing and/or assessing the electrical system's voltage unbalance in view of the determined effects of the motors and other three-phase loads on the electrical system's voltage unbalance to identify opportunities to improve electrical efficiency, performance, and increase equipment life and taking one or more actions based on or in response to the identified opportunities. In another embodiment, the method also includes determining and addressing energy losses associated with voltage unbalance and, in yet another embodiment, the method also includes determining effects of additional unbalance on three-phase load heating.

Aspects of the present disclosure optionally use one or more digital or analog I/O signals to more optimally function. For example, one or more embodiments optionally use a digital status input signal from at least one single-phase or three-phase load (e.g., a polyphase induction motor) to simplify processing and/or enhancing its analysis(es), assessment(s), result(s) and/or recommendation(s). Alternatively, one or more embodiments may use an analog I/O signal from a load(s) (e.g., a polyphase induction motor) to incorporate measured temperatures (i.e., from thermocouple(s)) into its analysis(es), assessment(s), result(s), and/or recommendation(s). I/O signals may be produced or used by at least one of the IEDs, gateways, software systems, cloud-based systems or other applications as necessary.

It is to be understood that an input is data that a processor and/or IED receives, and an output is data that a processor and/or IED sends. Inputs and outputs may either be digital or analog. The digital and analog signals may be both discrete variables (e.g., two states such as high/low, one/zero, on/off, etc. If digital, this may be a value. If analog, the presence of a voltage/current may be considered by the system/IED as an equivalent signal) or continuous variables (e.g., continuously variable such as spatial position, temperature, pressure voltage, etc.). They may be digital signals (e.g., measurements in an IED coming from a sensor producing digital information/values) and/or analog signals (e.g., measurements in an IED coming from a sensor producing analog information/values). These digital and/or analog signals may include any processing step within the IED (e.g., derive an active power (kW), power factor, a magnitude, a relative phase angle, among all the derived calculations).

Processors and/or IEDs may convert/reconvert digital and analog input signals to a digital representation for internal processing. Processors and/or IEDs may also be used to convert/reconvert internally processed digital signals to digital and/or analog output signals to provide some indication, action, or other response (such as an input for another processor/IED). Typical uses of digital outputs may include signaling relays to open or close breakers or switches, signaling relays to start or stop motors and/or other equipment, and operating other devices and equipment that are able to directly interface with digital signals. Digital inputs are often used to determine the operational status/position of equipment (e.g., is a breaker open or closed, etc.) or read an input synchronous signal from a utility pulsed output. Analog outputs may be used to provide variable control of valves, motors, heaters, or other loads/processes in energy management systems. Finally, analog inputs may be used to gather variable operational data and/or in proportional control schemes.

A few more examples where digital and analog I/O data are leveraged may include (but not be limited to): turbine controls, plating equipment, fermenting equipment, chemical processing equipment, telecommunications, equipment, precision scaling equipment, elevators and moving sidewalks, compression equipment, waste water treatment equipment, sorting and handling equipment, plating equipment temperature/pressure data logging, electrical generation/transmission/distribution, robotics, alarm monitoring and control equipment, as a few examples.

The above-discussed method (and/or other systems and/or methods discussed herein) may include one or more of the following features either individually or in combination with other features in some embodiments. For example, in some embodiments the energy-related signals captured by the at least one IED may include at least one of: a voltage signal, a current signal, an input/output (I/O) data, and a derived energy-related value. In some embodiments, the I/O data includes at least one of on/off status(es), open/closed status(es), high/low status(es), temperature(s), pressure(s), and volume(s). Additionally, in some embodiments the derived energy-related value includes at least one of: a calculated, computed, estimated, derived, developed, interpolated, extrapolated, evaluated, and otherwise determined additional energy-related value from the at least one of the voltage signal and/or the current signal. In some embodiments, the derived energy-related value includes at least one of: active power, apparent power, reactive power, energy, harmonic distortion, power factor, magnitude/direction of harmonic power(s), harmonic voltage(s), harmonic current(s), interharmonic current(s), interharmonic voltage(s), magnitude/direction of interharmonic power(s), magnitude/direction of sub-harmonic power(s), individual phase currents, phase angle(s), impedance(s), sequence component(s), total voltage harmonic distortion, total current harmonic distortion, three-phase current(s), phase voltage(s), line voltage(s) and/or other similar/related parameters. In some embodiments, the derived energy-related value includes at least one energy-related characteristic, the energy-related characteristic including magnitude, direction, phase angle, percentage, ratio, level, duration, associated frequency components, impedance, energy-related parameter shape, and/or decay rate. It is understood that the energy-related signals may include (or leverage) substantially any electrical parameter derived from at least one of the voltage and current signals (including the voltages and currents themselves), including, for example, load levels and patterns, as will be understood from further discussions below.

In some embodiments, the above-discussed method (and/or other system(s) and/or method(s) discussed herein) may be implemented on the at least one IED called for in the above-discussed method (and/or other systems and/or methods discussed herein). Additionally, in some embodiments the above-discussed method (and/or other systems and/or methods discussed herein) may be implemented partially or fully remote from the at least one IED, for example, in a gateway, a cloud-based system, on-site software, a remote server, etc. (which may alternatively be referred to as a "head-end" or "edge" system herein). In some embodiments, the at least one IED may be coupled to measure energy-related signals, receive electrical measurement data from or derived from the energy-related signals at an input, and configured to generate at least one or more outputs. The outputs may be used to identify the at least one potential load type associated with the characterized and/or quantified at least one identified variation/change in the electrical system. Examples of the at least one IED may include a smart utility meter, a power quality meter, and/or another measurement device (or devices). The at least one IED may include breakers, relays, power quality correction devices, uninterruptible power supplies (UPSs), filters, and/or variable speed drives (VSDs), for example. Additionally, the at least one IED may include at least one virtual (e.g., residual energy-related signal measurement, calculations or derivations) meter in some embodiments.

In some embodiments, the energy-related signals may be continuously or semi-continuously captured and/or logged by the at least one IED, and variation(s)/change(s) identified in the energy-related signals may be updated (e.g., evaluated/re-evaluated, prioritized/re-prioritized, tracked, etc.) in response thereto. For example, variation(s)/change(s) may initially be identified from energy-related signals captured at a first time, and may be updated or revised in response to (e.g., to include or incorporate) variation(s)/change(s) identified from energy-related signals captured at a second time. As variation(s)/change(s) are identified, the variation(s)/change(s) may be characterized and/or quantified, information related to the characterized and/or quantified identified variation(s)/change(s) may be appended to time-series information associated with energy-related data, and characteristics and/or quantities associated with the time-series information may be evaluated to identify at least one potential load type associated with the characterized and/or quantified identified variation(s)/change(s), for example. The appended information may include, for example, tagged indications on the time-series information, metadata, characteristics and/or other information related to the characterized and/or quantified identified variation(s)/change(s).

As used herein, the terms "up-line" and "down-line" (also sometimes referred to as "upstream" and "downstream", respectively) are used to refer to electrical locations within an electrical system. More particularly, the electrical locations "up-line" and "down-line" are relative to an electrical location of an IED collecting data and providing this information. For example, in an electrical system including a plurality of IEDs, one or more IEDs may be positioned (or installed) at an electrical location that is up-line relative to one or more other IEDs in the electrical system, and the one or more IEDs may be positioned (or installed) at an electrical location that is down-line relative to one or more further IEDs in the electrical system. A first IED or load that is positioned on an electrical circuit up-line from a second IED or load may, for example, be positioned electrically closer to an input or source of the electrical system (e.g., an electrical generator or a utility feed) than the second IED or load. Conversely, a first IED or load that is positioned on an electrical circuit down-line from a second IED or load may be positioned electrically closer to an end or terminus of the electrical system than the other IED (so in this case, it will be closer to a load or group of loads).

A first IED or load that is electrically connected in parallel (e.g., on an electrical circuit) with a second IED or load may be considered to be "electrically" up-line from said second IED or load in embodiments, and vice versa. In embodiments, algorithm(s) used for determining a direction of a power quality event (i.e., up-line or down-line) is/are located (or stored) in the IED, cloud, on-site software, gateway, etc. As one example, the IED can record an electrical event's voltage and current phase information (e.g., by sampling the respective signals) and communicatively transmit this information to a cloud-based system. The cloud-based system may then analyze the voltage and current phase information (e.g., instantaneous, root-mean-square (rms), waveforms and/or other electrical characteristic) to determine if the source/origin of an energy-related transient (or other energy-related event) is electrically up-line or down-line from where the IED is electrically coupled to the electrical system (or network).

In some embodiments, the energy-related data from or derived from the energy-related signals captured by the at least one IED is processed on at least one of: the cloud-based system, the on-site or edge software, the gateway, and the other head-end system associated with the electrical system. In these embodiments, for example, the at least one IED may be communicatively coupled to the at least one of: the cloud-based system, the on-site or edge software, the gateway, and the other head-end system on which the electrical measurement data is processed, analyzed, and/or displayed. In some embodiments, data associated with the energy-related data is stored (e.g., in a memory device of at least one device or system associated with the electrical system) and/or tracked over a predetermined time period. The predetermined time period may be a user-configured time period, for example. In some embodiments, the stored and/or tracked data includes information associated with identifying the at least one potential load type. The information associated with identifying the at least one potential load type may include, for example, at least one of: the at least one identified variation/change, the characterized and/or quantified at least one identified variation/change, the time-series information, and the evaluated characteristics and/or quantities associated with the time-series information. In some embodiments, the information associated with identifying the at least one potential load type may be saved and/or tracked for future analyses/uses. For example, the stored and/or tracked information may be used to generate a library of load types and associated start/run/change/stop characteristics and/or be added to a pre-existing library of load types and associated start/run/change/stop characteristics. In embodiments in which there is a pre-existing library of load types and associated start/run/change/stop characteristics, the at least one potential load type identified using the systems and methods described herein may be selected from a plurality of potential loads types in the pre-existing library of load types and associated start/run/change/stop characteristics.

In some embodiments, the above-described system may correspond to a control system (e.g., the previously discussed control system) used for monitoring or controlling one or more parameters associated with the electrical system. As previously discussed, in some embodiments, the control system may be a meter, an IED (e.g., of the at least one IED responsible for capturing the energy-related signals), programmable logic controller (PLC), on-site/head-end software (i.e., a software system), a cloud-based control system, a gateway, a system in which data is routed over the Ethernet or some other communications system, etc.

It is understood that the systems and methods described herein may be responsive to changes in the electrical system(s) in which the systems and methods are provided and/or implemented. For example, the prescribed threshold or thresholds that the at least one identified variation/change is compared to determine if the at least one identified variation/change meets the prescribed threshold or thresholds, may be a dynamic threshold or thresholds that change in response to changes in the electrical system(s). The changes in the electrical system(s) may be detected, for example, from the energy-related signals captured by the at least one IED in the electrical system(s). In one example implementation, the changes are detected after manually training/teaching a system to identify the changes. For example, the specific equipment (or processes) operating at a given time may be described to allow the system to learn (i.e., a form of machine learning). In another example implementation, the changes are detected by automatically identifying operational modes using state of the art machine learning algorithms (e.g., using time series clustering or using spectral or any other algorithms helpful in analysis to identify patterns).

As will become further appreciated from discussions below, the disclosed invention provides, among other features, the ability to characterize voltage, current, and other derived signals to better understand upstream and downstream loads, their operation(s) and impact(s) to the electrical system. The ability to automatically evaluate energy-related data to associate, characterize, quantify, identify, and analyze helps end-users to better understand the operation of their electrical system. It may also provide many more services and solutions opportunities to energy-related companies, such as Schneider Electric, the assignee of the present disclosure.

It is understood that the at least one energy-related waveform capture described in connection with the above method (and the other methods and systems discussed below) may be associated with energy-related signals captured or measured by the at least one IED. For example, in accordance with some embodiments of this disclosure, the at least one energy-related waveform capture may be generated from at least one energy-related signal captured or measured by the at least one IED. According to IEEE Standard 1057-2017, for example, a waveform is "[a] manifestation or representation (e.g., graph, plot, oscilloscope presentation, discrete time series, equations, table of coordinates, or statistical data) or a visualization of a signal." With this definition in mind, the at least one energy-related waveform may correspond to a manifestation or representation or a visualization of the at least one energy-related signal. It is understood that the above relationship is based on one standards body's (IEEE in this case) definition of a waveform, and other relationships between a waveform and a signal are of course possible, as will be understood by one of ordinary skill in the art.

It is understood that the energy-related signals or waveforms captured or measured by the at least one IED may include (or leverage) substantially any electrical parameter derived from at least one of the voltage and current signals (including the voltages and currents themselves), for example. It is also understood that the energy-related signals or waveforms may be continuously or semi-continuously/periodically captured/recorded and/or transmitted and/or logged by the at least one IED. As noted above, the at least one captured energy-related waveform may be analyzed (e.g., in real-time, pseudo-real time, or historically) to determine if the at least one captured energy-related waveform is capable of being compressed, while maintaining relevant attributes for characterization, analysis and/or other use.

In some embodiments, the at least one IED capturing energy-related waveforms includes at least one metering device. The at least one metering device may correspond, for example, to at least one metering device in the electrical system for which the energy-related waveforms are being captured/monitored.

It is understood that the terms "processor" and "controller" are sometimes used interchangeably herein. For example, a processor may be used to describe a controller. Additionally, a controller may be used to describe a processor.

Embodiments of the present disclosure may comprise a special purpose computer including a variety of computer hardware, as described in greater detail herein.

For purposes of illustration, programs and other executable program components may be shown as discrete blocks. It is recognized, however, that such programs and components reside at various times in different storage components of a computing device, and are executed by a data processor(s) of the device.

Although described in connection with an example computing system environment, embodiments of the aspects of the invention are operational with other special purpose computing system environments or configurations. The computing system environment is not intended to suggest any limitation as to the scope of use or functionality of any aspect of the invention. Moreover, the computing system environment should not be interpreted as having any dependency or requirement relating to any one or combination of components illustrated in the example operating environment. Examples of computing systems, environments, and/or configurations that may be suitable for use with aspects of the invention include, but are not limited to, personal computers, server computers, hand-held or laptop devices, multiprocessor systems, microprocessor-based systems, set top boxes, programmable consumer electronics, mobile telephones, network PCs, minicomputers, mainframe computers, distributed computing environments that include any of the above systems or devices, and the like.

Embodiments of the aspects of the present disclosure may be described in the general context of data and/or processor-executable instructions, such as program modules, stored one or more tangible, non-transitory storage media and executed by one or more processors or other devices. Generally, program modules include, but are not limited to, routines, programs, objects, components, and data structures that perform particular tasks or implement particular abstract data types. Aspects of the present disclosure may also be practiced in distributed computing environments where tasks are performed by remote processing devices that are linked through a communications network. In a distributed computing environment, program modules may be located in both local and remote storage media including memory storage devices.

In operation, processors, computers and/or servers may execute the processor-executable instructions (e.g., software, firmware, and/or hardware) such as those illustrated herein to implement aspects of the invention.

Embodiments may be implemented with processor-executable instructions. The processor-executable instructions may be organized into one or more processor-executable components or modules on a tangible processor readable storage medium. Also, embodiments may be implemented with any number and organization of such components or modules. For example, aspects of the present disclosure are not limited to the specific processor-executable instructions or the specific components or modules illustrated in the figures and described herein. Other embodiments may include different processor-executable instructions or components having more or less functionality than illustrated and described herein.

The order of execution or performance of the operations in accordance with aspects of the present disclosure illustrated and described herein is not essential, unless otherwise specified. That is, the operations may be performed in any order, unless otherwise specified, and embodiments may include additional or fewer operations than those disclosed herein. For example, it is contemplated that executing or performing a particular operation before, contemporaneously with, or after another operation is within the scope of the invention.

When introducing elements of the invention or embodiments thereof, the articles "a," "an," "the," and "said" are intended to mean that there are one or more of the elements. The terms "comprising," "including," and "having" are intended to be inclusive and mean that there may be additional elements other than the listed elements.

Not all of the depicted components illustrated or described may be required. In addition, some implementations and embodiments may include additional components. Variations in the arrangement and type of the components may be made without departing from the spirit or scope of the claims as set forth herein. Additional, different or fewer components may be provided and components may be combined. Alternatively, or in addition, a component may be implemented by several components.

The above description illustrates embodiments by way of example and not by way of limitation. This description enables one skilled in the art to make and use aspects of the invention, and describes several embodiments, adaptations, variations, alternatives and uses of the aspects of the invention, including what is presently believed to be the best mode of carrying out the aspects of the invention. Additionally, it is to be understood that the aspects of the invention are not limited in its application to the details of construction and the arrangement of components set forth in the following description or illustrated in the drawings. The aspects of the invention are capable of other embodiments and of being practiced or carried out in various ways. Also, it will be understood that the phraseology and terminology used herein is for the purpose of description and should not be regarded as limiting.

It will be apparent that modifications and variations are possible without departing from the scope of the invention defined in the appended claims. As various changes could be made in the above constructions and methods without departing from the scope of the invention, it is intended that all matter contained in the above description and shown in the accompanying drawings shall be interpreted as illustrative and not in a limiting sense.

In view of the above, it will be seen that several advantages of the aspects of the invention are achieved and other advantageous results attained.

The Abstract and Summary are provided to help the reader quickly ascertain the nature of the technical disclosure. They are submitted with the understanding that they will not be used to interpret or limit the scope or meaning of the claims. The Summary is provided to introduce a selection of concepts in simplified form that are further described in the Detailed Description. The Summary is not intended to identify key features or essential features of the claimed subject matter, nor is it intended to be used as an aid in determining the claimed subject matter.

The invention claimed is:

1. A method of assessing and managing an electrical unbalance condition associated with a three-phase electrical system under analysis, the method comprising:
    acquiring, by at least one Intelligent Electronic Device (IED) of the electrical system, energy-related signals associated with the electrical system, the energy-related signals comprising a plurality of measurements taken over time from a plurality of conductors;
    processing the energy-related signals acquired by the at least one IED to construct a characterization of an electrical unbalance between the plurality of conductors based on the energy-related signals;
    analyzing data associated with the characterization to identify the electrical unbalance across the plurality of conductors; and
    determining the extent of contribution of one or more electrical sources, and the extent of contribution of one or more loads in the electrical system, to the identified electrical unbalance condition.

2. The method of claim 1, wherein the plurality of conductors includes at least one of phase-to-phase conductors, phase-to-neutral conductors, and phase-to-ground conductors.

3. The method of claim 1, wherein processing the energy-related signals to construct the characterization comprises comparing the plurality of measurements from the plurality of conductors with each other to determine where the identified electrical unbalance between the plurality of conductors is originating.

4. The method of claim 1, wherein the data associated with the characterization comprises three-phase load data, the three-phase load data from the energy-related signals comprising at least one of three-phase voltage data, three-phase current data, and three-phase power data.

5. The method of claim 4, wherein the three-phase load data comprises a multiple of three data sets acquired at different times, each data set comprising a measurement value acquired from each phase of three-phase loads in the electrical system.

6. The method of claim 5, wherein each measurement value comprises a discrete sample acquired synchronously from each phase of three-phase loads in the electrical system.

7. The method of claim 5, wherein each measurement values comprises an average of two or more samples acquired from each phase of three-phase loads in the electrical system.

8. The method of claim 1, wherein the extent of the contribution of the one or more electrical sources, and the extent of the contribution of the one or more loads in the electrical system, to the identified electrical unbalance condition is determined by executing a matrix shift operation on the data associated with the characterization of electrical unbalance between the plurality of conductors.

9. The method of claim 8, wherein executing the matrix shift operation comprises:
    arranging the data associated with the characterization in a matrix such that each row of the first matrix corresponds to the measurement values for one of the data sets acquired at the same time and each column of the first matrix corresponds to the measurement values for one of the phases acquired at different times;
    shifting the measurement values in the matrix on at least one of a column basis and a row basis to construct a solution set;
    constructing an analysis set of summed values by adding the shifted measurement values in each row of the solution set or by adding the shifted measurement values in each column of the solution set; and
    assessing a level of unbalance as a function of a range of variation of summed values in the analysis set.

10. The method of claim 9, wherein the extent of the contribution of the one or more electrical sources, and the extent of the contribution of the one or more loads in the electrical system, to the identified electrical unbalance condition is determined by comparing the assessed degree of unbalance as a function of the summed values by adding the shifted measurement values in each row of the matrix to the assessed degree of unbalance as a function of the summed values by adding the shifted measurement values in each column of the matrix.

11. The method of claim 1, wherein the extent of the contribution of the one or more electrical sources, and the extent of the contribution of the one or more loads in the electrical system, to the identified electrical unbalance condition is determined by determining if a primary source of unbalance originates upstream or downstream from the IED.

12. The method of claim 1, further comprising generating one or more actions for mitigating the electrical unbalance condition based on the location thereof relative to the IED.

13. The method of claim 12, wherein the actions for mitigating the voltage unbalance condition comprise one or more of the following: balancing distribution impedances of the electrical system; equally distributing single-phase loads on all three phases of the electrical system; load balancing; isolating single-phase loads from critical three-phase distribution systems; and installing a mitigation device in the electrical system.

14. The method of claim 1, wherein the load change event comprises at least one of a load energization, a load de-energization, a load variation, and an impedance change due to a fault.

15. The method of claim 1, wherein acquiring the energy-related signals comprises measuring at least one of three-phase current, three-phase voltage, and three-phase power of three-phase loads by the at least one IED of the electrical system.

16. A system for assessing and managing an electrical unbalance condition associated with a three-phase electrical system under analysis, the system comprising:

at least one Intelligent Electronic Device (IED) communicatively coupled to the three-phase load of the electrical system, the IED configured to acquire energy-related signals associated with the electrical system, the energy-related signals comprising a plurality of measurements taken over time from a plurality of conductors;

a processor receiving and responsive to the energy-related signals acquired by the at least one IED; and a memory storing processor-executable instructions that, when executed, configure the processor to:

construct a characterization of an electrical unbalance between the plurality of conductors based on the energy-related signals;

analyze data associated with the characterization to identify the electrical unbalance across the plurality of conductors; and determine the extent of contribution of one or more electrical sources, and the extent of contribution of one or more loads in the electrical system, to the identified electrical unbalance condition.

17. The system of claim 16, wherein the data associated with the characterization comprises three-phase load data, the three-phase load data from the energy-related signals comprising at least one of three-phase voltage data, three-phase current data, and three-phase power data.

18. The system of claim 17, wherein the three-phase load data comprises a multiple of three data sets acquired at different times, each data set comprising a measurement value acquired from each phase of three-phase loads in the electrical system.

19. The system of claim 18, wherein each measurement value comprises a discrete sample acquired synchronously from each phase of three-phase loads in the electrical system.

20. The system of claim 18, wherein each measurement values comprises an average of two or more samples acquired from each phase of three-phase loads in the electrical system.

21. The system of claim 17, wherein the processor-executable instructions, when executed, further configure the processor to execute a matrix shift operation on the data associated with the characterization of the electrical unbalance between the plurality of conductors for determining the extent of the contribution of the one or more electrical sources, and the extent of the contribution of the one or more loads in the electrical system, to the identified electrical unbalance condition.

22. The system of claim 21, wherein the processor-executable instructions, when executed, further configure the processor:

arrange the data associated with the characterization in a matrix such that each row of the first matrix corresponds to the measurement values for one of the data sets acquired at the same time and each column of the first matrix corresponds to the measurement values for one of the phases of the three-phase load data acquired at different times;

shift the measurement values in the matrix on at least one of a column basis and a row basis to construct a solution set;

construct an analysis set of summed values by adding the shifted measurement values in each row of the solution set or by adding the shifted measurement values in each column of the solution set; and assess a degree of unbalance as a function of a range of variation of summed values in the analysis set.

23. The system of claim 22, wherein the processor-executable instructions, when executed, further configure the processor to compare the assessed degree of unbalance as a function of the summed values by adding the shifted measurement values in each row of the matrix to the assessed degree of unbalance as a function of the summed values by adding the shifted measurement values in each column of the matrix for determining the extent of the contribution of the one or more electrical sources, and the extent of the contribution of the one or more loads in the electrical system, to the electrical unbalance condition.

24. The system of claim 16, wherein the processor-executable instructions, when executed, further configure the processor to determine if a primary source of unbalance originates upstream or downstream from the IED for determining the extent of the contribution of the one or more electrical sources, and the extent of the contribution of the one or more loads in the electrical system, to the identified electrical unbalance condition.

25. The system of claim 16, wherein the processor-executable instructions, when executed, further configure the processor to generate one or more actions for mitigating the electrical unbalance condition based on the location thereof relative to the IED.

26. The system of claim 25, wherein the actions for mitigating the electrical unbalance condition comprise one or more of the following: balancing distribution impedances of the electrical system; equally distributing single-phase loads on all three phases of the electrical system; load balancing; isolating single-phase loads from critical three-phase distribution systems; and installing a mitigation device in the electrical system.

27. The system of claim 16, wherein the load change event comprises at least one of a load energization, a load de-energization, a load variation, and an impedance change due to a fault.

28. The system of claim 16, wherein the processor-executable instructions, when executed, further configure the processor to measure at least one of three-phase current, three-phase voltage, and three-phase power of the three-phase load by the at least one IED of the electrical system for acquiring the energy-related signals.

* * * * *